United States Patent
Lichtenwalner et al.

(10) Patent No.: US 11,837,629 B2
(45) Date of Patent: Dec. 5, 2023

(54) POWER SEMICONDUCTOR DEVICES HAVING GATE TRENCHES AND BURIED EDGE TERMINATIONS AND RELATED METHODS

(71) Applicant: Wolfspeed, Inc., Durham, NC (US)

(72) Inventors: Daniel J. Lichtenwalner, Raleigh, NC (US); Edward R. Van Brunt, Raleigh, NC (US); Brett Hull, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 244 days.

(21) Appl. No.: 16/952,757

(22) Filed: Nov. 19, 2020

(65) Prior Publication Data
US 2021/0098568 A1    Apr. 1, 2021

Related U.S. Application Data

(63) Continuation of application No. 15/372,505, filed on Dec. 8, 2016, now Pat. No. 10,861,931.

(51) Int. Cl.
H01L 29/06 (2006.01)
H01L 29/10 (2006.01)
(Continued)

(52) U.S. Cl.
CPC .......... *H01L 29/063* (2013.01); *H01L 21/046* (2013.01); *H01L 29/0623* (2013.01); *H01L 29/1095* (2013.01); *H01L 29/66068* (2013.01); *H01L 29/66734* (2013.01); *H01L 29/7397* (2013.01); *H01L 29/7811* (2013.01);
(Continued)

(58) Field of Classification Search
CPC ............... H01L 29/063; H01L 29/0623; H01L 29/1095; H01L 29/66068; H01L 29/66734; H01L 29/7397; H01L 29/7811; H01L 29/7813; H01L 29/0615; H01L 29/0619;
(Continued)

(56) References Cited

U.S. PATENT DOCUMENTS 7,989,882 B2    8/2011    Zhang et al.
8,232,558 B2    7/2012    Zhang et al.
(Continued)

FOREIGN PATENT DOCUMENTS

CN    104737296 A    6/2015
CN    104854704 A    8/2015
(Continued)

OTHER PUBLICATIONS

First Examination Report issued in corresponding India Patent Application No. 201947018763, dated Sep. 26, 2020.
(Continued)

*Primary Examiner* — Thao X Le
*Assistant Examiner* — Eric W Jones
(74) *Attorney, Agent, or Firm* — Myers Bigel, P.A.

(57) ABSTRACT

Semiconductor devices include a semiconductor layer structure comprising a drift region that includes a wide band-gap semiconductor material. A shielding pattern is provided in an upper portion of the drift region in an active region of the device and a termination structure is provided in the upper portion of the drift region in a termination region of the device. A gate trench extends into an upper surface of the semiconductor layer structure. The semiconductor layer structure includes a semiconductor layer that extends above and at least partially covers the termination structure.

21 Claims, 10 Drawing Sheets

(51) Int. Cl.
  *H01L 29/78* (2006.01)
  *H01L 21/04* (2006.01)
  *H01L 29/66* (2006.01)
  *H01L 29/739* (2006.01)
  *H01L 29/16* (2006.01)
  *H01L 29/08* (2006.01)

(52) U.S. Cl.
  CPC ...... *H01L 29/7813* (2013.01); *H01L 29/0615* (2013.01); *H01L 29/0619* (2013.01); *H01L 29/0696* (2013.01); *H01L 29/0878* (2013.01); *H01L 29/1037* (2013.01); *H01L 29/1608* (2013.01)

(58) Field of Classification Search
  CPC .............. H01L 29/0696; H01L 29/0878; H01L 29/1037; H01L 29/1608; H01L 21/046
  USPC ........................................................... 257/77
  See application file for complete search history.

(56) References Cited

U.S. PATENT DOCUMENTS

| | | | |
|---|---|---|---|
| 8,415,671 | B2 | 4/2013 | Zhang |
| 9,012,984 | B2 | 4/2015 | Cheng et al. |
| 2005/0167695 | A1 | 8/2005 | Yilmaz |
| 2005/0280086 | A1 | 12/2005 | Saito et al. |
| 2008/0258152 | A1 | 10/2008 | Yamamoto et al. |
| 2010/0258856 | A1 | 10/2010 | Hsieh |
| 2011/0084354 | A1 | 4/2011 | Honda et al. |
| 2011/0254010 | A1 | 10/2011 | Zhang |
| 2012/0220091 | A1 | 8/2012 | Challa et al. |
| 2013/0037851 | A1 | 2/2013 | Toshiba |
| 2013/0140633 | A1 | 6/2013 | Pattanayak |
| 2014/0145212 | A1 | 5/2014 | Takeuchi et al. |
| 2014/0264477 | A1 | 9/2014 | Bhalla et al. |
| 2014/0264562 | A1 | 9/2014 | Cheng et al. |
| 2014/0264563 | A1 | 9/2014 | Cheng et al. |
| 2015/0084125 | A1 | 3/2015 | Pala et al. |
| 2015/0115286 | A1 | 4/2015 | Takeuchi et al. |
| 2015/0187868 | A1 | 7/2015 | Park et al. |
| 2015/0236119 | A1 | 8/2015 | Tanaka et al. |
| 2015/0303267 | A1 | 10/2015 | Masuda et al. |
| 2015/0333153 | A1 | 11/2015 | Eguchi et al. |
| 2015/0364577 | A1 | 12/2015 | Nishimura et al. |
| 2016/0005837 | A1 | 1/2016 | Cheng et al. |
| 2016/0126347 | A1 | 5/2016 | Wada et al. |
| 2016/0133741 | A1 | 5/2016 | Matsuki et al. |
| 2016/0211334 | A1 | 7/2016 | Tanaka et al. |
| 2017/0047319 | A1 | 2/2017 | Naito et al. |
| 2017/0077290 | A1 | 3/2017 | Kono et al. |
| 2017/0200784 | A1 | 7/2017 | Shirakawa et al. |

FOREIGN PATENT DOCUMENTS

| | | |
|---|---|---|
| CN | 105590962 A | 5/2016 |
| JP | 2006511961 A | 4/2006 |
| JP | 2008103529 | 5/2008 |
| JP | 2009033036 | 2/2009 |
| JP | 2011091086 A | 5/2011 |
| JP | 2013219161 A | 10/2013 |
| JP | 2013258369 A | 12/2013 |
| JP | 2014139967 | 7/2014 |
| JP | 2014175518 | 9/2014 |
| JP | 2015204411 | 11/2015 |
| JP | 2016092257 | 5/2016 |

OTHER PUBLICATIONS

"English Translation of Second Office Action for corresponding Chinese Application No. 201780074972.7, dated Apr. 29, 22, 8 pages".

Communication Pursuant to Article 94(3) EPC, dated Aug. 17, 2021, for corresponding European Application No. 17 781 346.6.

"English Translation of Office Action for corresponding Chinese Application No. 201780074972.7, dated Nov. 25, 2021, 11 pages".

Office Action dated Jul. 22, 2020 in corresponding Japanese Application No. 2019-530787, including English translation.

Yasuhiro Kagawa, Rina Tanaka, N. Fujiwara, K. Sugawara, Y. Fukui, N. Miura, M. Imaizumi, S. Nakata, and S. Yamakawa, Introduction of depletion stopper for reduction of JFET resistance for 4H-SiC Trench MOSFET, Materials Science Forum, vols. 821-823 (2015), pp. 761-764.

Notification of Transmittal of the International Search Report and the Written Opinion of the International Searching Authority, or the Declaration, corresponding to International Application No. PCT/US2017/054224, dated Dec. 6, 2017, 17 pgs.

Notification Concerning Transmittal of International Preliminary Report on Patentability, corresponding to International Application No. PCT/US2017/054224, dated Jun. 20, 2019, 12 pages.

R-Face SiC reference: Toru Hiyoshi, Takeyoshi Masuda, Keiji Wada, Shin Harada, Takashi Tsuno and Yasuo Namikawa, SiC High Channel Mobility MOSFET, SEI Technical Review No. 77 Oct. 2013, pp. 122-126.

POWER SEMICONDUCTOR DEVICES HAVING GATE TRENCHES AND BURIED EDGE TERMINATIONS AND RELATED METHODS

CROSS-REFERENCE TO RELATED APPLICATION

This application is a continuation of U.S. patent application Ser. No. 15/372,505, filed Dec. 8, 2016, entitled "POWER SEMICONDUCTOR DEVICES HAVING GATE TRENCHES AND BURIED EDGE TERMINATIONS AND RELATED METHODS," the contents of which is incorporated herein by reference as if set forth in its entireties.

STATEMENT OF U.S. GOVERNMENT INTEREST

This invention was made with Government support under Cooperative Agreement No. W911NF-12-2-0064 funded by the Army Research Laboratory. The Government has certain rights in the invention.

FIELD OF THE INVENTION

The present invention relates to power semiconductor devices and, more particularly, to power semiconductor devices having gate trenches and to methods of fabricating such devices.

BACKGROUND

Power semiconductor devices are used to carry large currents and support high voltages. A wide variety of power semiconductor devices are known in the art including, for example, power Metal Oxide Semiconductor Field Effect Transistors ("MOSFET"), bipolar junction transistors ("BJTs"), Insulated Gate Bipolar Transistors ("IGBT"), Junction Barrier Schottky diodes, Gate Turn-Off Transistors ("GTO"), MOS-controlled thyristors and various other devices. These power semiconductor devices are generally fabricated from wide band-gap semiconductor materials such as silicon carbide ("SiC") or gallium nitride ("GaN") based semiconductor materials.

Power semiconductor devices can have a lateral structure or a vertical structure. In a device having a lateral structure, the terminals of the device (e.g., the drain, gate and source terminals for a power MOSFET device) are on the same major surface (i.e., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes one or more semiconductor layers such as semiconductor substrates and/or semiconductor epitaxial layers.

A conventional power semiconductor device typically has a semiconductor substrate, such as a silicon carbide substrate having a first conductivity type (e.g., an n-type substrate), on which an epitaxial layer structure having the first conductivity type (e.g., n-type) is formed. This epitaxial layer structure (which may comprise one or more separate layers) functions as a drift region of the power semiconductor device. The device typically includes an "active region" which includes one or more power semiconductor devices that have a junction such as a p-n junction. The active region may be formed on and/or in the drift region. The active region acts as a main junction for blocking voltage in the reverse bias direction and providing current flow in the forward bias direction. The power semiconductor device may also have an edge termination region adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices. The power semiconductor devices may have a unit cell structure in which the active region of each power semiconductor device includes a plurality of individual devices that are disposed in parallel to each other and that together function as a single power semiconductor device.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. However, as the applied voltage approaches or passes the voltage level that the device is designed to block, non-trivial levels of current may begin to flow through the power semiconductor device. Such current, which is typically referred to as "leakage current," may be highly undesirable. Leakage current may begin to flow if the voltage is increased beyond the design voltage blocking capability of the device, which may be a function of, among other things, the doping and thickness of the drift region. Leakage currents may also arise for other reasons, such as failure of the edge termination and/or the primary junction of the device. If the voltage on the device is increased past the breakdown voltage to a critical level, the increasing electric field may result in an uncontrollable and undesirable runaway generation of charge carriers within the semiconductor device, leading to a condition known as avalanche breakdown.

A power semiconductor device may also begin to allow non-trivial amounts of leakage current to flow at a voltage level that is lower than the design breakdown voltage of the device. In particular, leakage current may begin to flow at the edges of the active region, where high electric fields may be experienced due to electric field crowding effects. In order to reduce this electric field crowding (and the resulting increased leakage currents), edge termination structures may be provided that surround part or all of the active region of a power semiconductor device. These edge terminations may spread the electric field out over a greater area, thereby reducing the electric field crowding.

SUMMARY

Pursuant to embodiments of the present invention, semiconductor devices are provided that include a semiconductor layer structure comprising a drift region that includes a wide band-gap semiconductor material. A shielding pattern is provided in an upper portion of the drift region in an active region of the device and a termination structure is provided in the upper portion of the drift region in a termination region of the device. A gate trench extends into an upper surface of the semiconductor layer structure. The semiconductor layer structure includes a semiconductor layer that extends above and at least partially covers the termination structure.

The semiconductor device may also include a gate insulation layer in the gate trench that at least partially covers the bottom surface and sidewalls of the gate trench, a gate electrode in the gate trench on the gate insulation layer, a first contact on the upper surface of the semiconductor layer structure and a second contact on a lower surface of the semiconductor layer structure. The semiconductor device may further include comprising first and second well regions on opposed sides of the gate trench. The drift region may have a first conductivity type and the well regions may have a second conductivity type that is opposite the first conductivity type.

In some embodiments, a bottom of the shielding pattern extends farther into the drift region than does a bottom surface of the gate trench. The termination structure may comprise, for example, one of guard rings or a junction termination extension.

In some embodiments, the semiconductor layer may have a doping density of less than $1 \times 10^{16}/cm^3$.

In some embodiments, upper surfaces of the first and second well regions may be coplanar with an upper surface of the semiconductor layer.

In some embodiments, the first and second well regions may be implanted well regions that are implanted with dopants having the second conductivity type.

In some embodiments, a first portion of the first well region that is spaced apart from the gate trench may have a first dopant concentration and a channel of the semiconductor device that is directly adjacent the gate trench may have a second dopant concentration that is lower than the first dopant concentration.

In some embodiments, the first well region may have a non-uniform dopant concentration of dopants of the second conductivity type along an axis that extends parallel to a lower surface of the semiconductor layer structure.

In some embodiments, the drift region may be doped with dopants having a first conductivity type, while in other embodiments the drift region may be doped with dopants having a first conductivity type. A portion of the semiconductor layer that is in the termination region may be doped with dopants having the first conductivity type at a concentration of less than $1 \times 10^{15}/cm^3$.

Pursuant to further embodiments of the present invention, semiconductor devices are provided that include a semiconductor layer structure, the semiconductor layer structure comprising a drift region that includes a wide band-gap semiconductor material doped with dopants having a first conductivity type, a gate trench that extends into an upper surface of the semiconductor layer structure, a first shielding pattern doped with dopants having a second conductivity type that is opposite the first conductivity type in an upper portion of the drift region, a first well region above the first shielding pattern and adjacent a first side of the gate trench, the first well region doped with dopants having the second conductivity type, a second shielding pattern doped with dopants having the second conductivity type in the upper portion of the drift region, a second well region above the second shielding pattern and adjacent a second side of the gate trench, the second well region doped with dopants having the second conductivity type and a termination structure doped with dopants having the second conductivity type in the upper portion of the drift region. A channel of the semiconductor device that is between the first well region and a first side of the gate trench has a lower concentration of the second conductivity type dopants than the first well region.

In some embodiments, the semiconductor layer structure may include a semiconductor layer in a termination region of the semiconductor device that extends above and at least partially covers the termination structure.

In some embodiments, the semiconductor layer in the termination region may be doped with dopants having the second conductivity type.

In some embodiments, the semiconductor layer in the termination region may have a doping density of the second conductivity type dopants of less than $1 \times 10^{16}/cm^3$.

In some embodiments, the termination structure may comprise a plurality of termination elements, and bottom surfaces of the termination elements may be coplanar with a bottom surface of the first shielding pattern.

In some embodiments, a bottom surface of the first shielding pattern may extend farther down into the drift region than does a bottom surface of the gate trench.

In some embodiments, upper surfaces of the first and second well regions may be coplanar with an upper surface of the semiconductor layer in the termination region.

In some embodiments, the first well region may include a first portion that is doped with second conductivity type dopants at a first concentration and a second portion that is doped with second conductivity type dopants at a second concentration that exceeds the first concentration by at least a factor of five, where the second region extends from a top surface of the first well region to a bottom surface of the first well region.

Pursuant to further embodiments of the present invention, methods of forming a semiconductor device are provided in which a wide band-gap semiconductor drift region is formed on a substrate, the drift region and the semiconductor substrate each doped with dopants having a first conductivity type. Second conductivity type dopants are implanted into an upper surface of the drift region to form a termination structure in a termination region of the semiconductor device and a shielding pattern in an active region of the semiconductor device, the second conductivity type being opposite the first conductivity type. A semiconductor layer is formed on the upper surface of the drift region via epitaxial growth, the semiconductor layer having a dopant concentration of less than $1 \times 10^{16}/cm^3$ as grown. Second conductivity type dopants are implanted into the semiconductor layer in the active region. Gate trenches are formed in the semiconductor layer, the gate trenches extending into the upper surface of the drift region. A gate insulation layer and a gate electrode are sequentially formed in each gate trench. The portions of the semiconductor layer in the active region on opposed sides of the gate trenches comprise respective second conductivity well regions.

In some embodiments, the semiconductor layer may be doped with first conductivity type dopants. In other embodiments, the semiconductor layer may be doped with second conductivity type dopants.

In some embodiments, respective portions of the second conductivity type well regions that are adjacent the gate trenches may comprise channel regions, where each channel region has a lower concentration of the second conductivity type dopants than a remainder of the respective second conductivity type well regions.

In some embodiments, upper surfaces of the second conductivity type well regions may be coplanar with an upper surface of the semiconductor layer.

In some embodiments, the termination structure may comprise one of guard rings and a junction termination extension.

In some embodiments, the gate trenches may be formed before the second conductivity type dopants are implanted into the semiconductor layer in the active region. In other embodiments, the gate trenches may be formed after the second conductivity type dopants are implanted into the semiconductor layer in the active region. The wide band-gap semiconductor may comprise silicon carbide.

DETAILED DESCRIPTION

Figure 1:
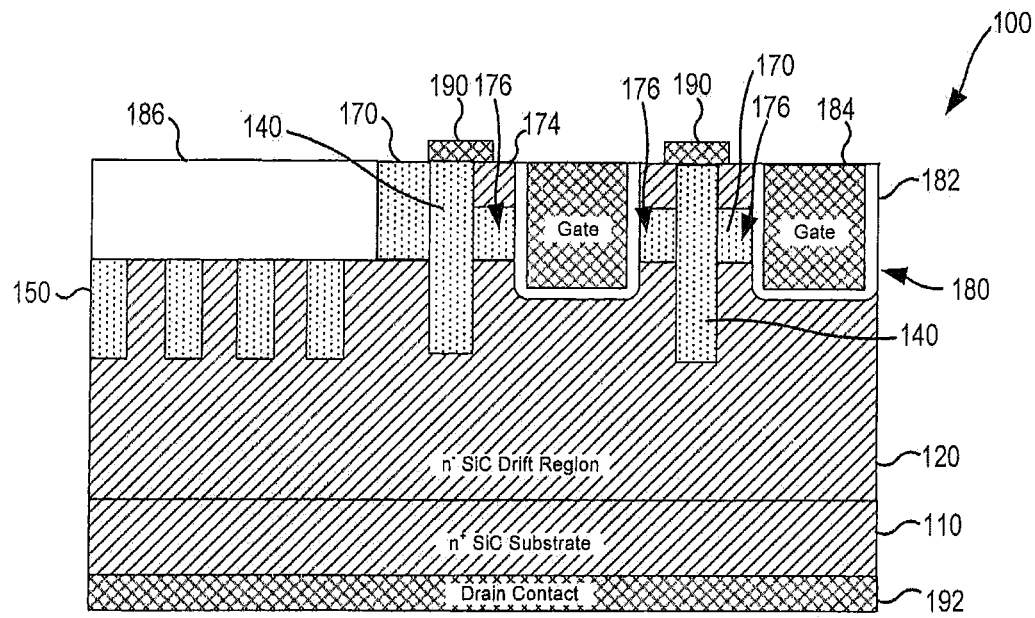
FIG. 1 is a schematic cross-sectional diagram of an example gate trench power MOSFET which has a termination structure in an etched or recessed surface thereof.

Vertical power semiconductor devices that include a MOSFET transistor can have a standard gate electrode design in which the gate electrode of the transistor is formed on top of the semiconductor layer structure or, alternatively, may have the gate electrode buried in a trench within the semiconductor layer structure. MOSFETs having buried gate electrodes are typically referred to as gate trench MOSFETs. With the standard gate electrode design, the channel region of each unit cell transistor is horizontally disposed underneath the gate electrode. In contrast, in the gate trench MOSFET design, the channel is vertically disposed. The gate trench MOSFET design lowers the on-resistance of the device due to a reduced device pitch obtained when taking the horizontal channel portion and making it vertical. In addition, for silicon carbide based devices, the vertical channel should have higher electron mobility, further reducing the on-resistance. However, fabrication of gate trench MOSFETs typically requires a more complicated manufacturing process.

Vertical gate trench MOSFETs that are formed using silicon carbide or various other wide band-gap semiconductor materials may be more difficult to fabricate because it can be more difficult to chemical etch these materials than Si, and in addition it may be more difficult to consistently dope these semiconductor materials. Herein a wide band-gap semiconductor material refers to a semiconductor material having a band-gap greater than 1.40 eV. The primary methods for doping a semiconductor material with n-type and/or p-type dopants are (1) doping the semiconductor material during the growth thereof, (2) diffusing the dopants into the semiconductor material and (3) using ion implantation to selectively implant the dopants in the semiconductor material. Each of these techniques may raise issues when used in the fabrication of power semiconductor devices that are formed in certain wide band-gap semiconductor materials such as silicon carbide and gallium nitride based materials.

For example, when silicon carbide is doped during epitaxial growth, the dopants tend to unevenly accumulate within the lattice structure, and hence it may be difficult to control the dopant concentration within a range of, for example, +/−15%. Thus, epitaxially grown silicon carbide may not have precisely controlled dopant concentrations, which can negatively affect device operation and/or reliability.

Doping by diffusion is routinely used in silicon and various other lower band-gap semiconductor materials. With this doping technique, typically a first region of the semiconductor device is doped either during growth or via ion implantation, and thereafter the device is annealed to diffuse the dopants into one or more other regions of the device. In some semiconductor materials such as silicon, n-type and p-type dopants may tend to diffuse easily and with consistent diffusion characteristics through the semiconductor material when heated, and hence the annealing step may be used to dope a defined region of the device to a certain doping level. Unfortunately, however, n-type and p-type dopants tend to not diffuse well in silicon carbide, even at high temperatures, and hence doping by diffusion is typically not an option for vertical silicon carbide based power semiconductor devices. This is also true in various other compound semiconductor materials such as gallium nitride based semiconductor materials, which dissociate before thermal diffusion can occur.

Silicon carbide can be doped effectively via ion implantation, and the dopant levels can typically be controlled with improved accuracy as compared to doping during epitaxial growth. However, in vertical power silicon carbide devices the dopants often need to be implanted deep into a device, such as depths of 1-3 microns or more. The depth at which the ions are implanted is directly related to the energy of the implant, i.e., ions implanted into a semiconductor layer at higher energies tend to go deeper into the layer. Thus, forming deep implanted regions requires high energy implants. When dopant ions are implanted into a semiconductor layer, the ions damage the crystal lattice of the semiconductor layer, and this damage typically can only be partly repaired by thermal annealing. Moreover, the amount of lattice damage is also directly related to implant energy, with higher energy implants tending to cause more lattice damage than lower energy implants, and the uniformity of the ion implant also tends to decrease with increasing implant depth. Thus, to form implanted regions that have good doping uniformity by depth and/or acceptable levels of lattice damage, it may be necessary to perform a multiple successive epitaxial growth/ion implantation steps to form a deep implant. This may significantly increase the complexity and cost of the manufacturing process and may not be a commercially viable option in many instances.

FIG. 1 is a schematic cross-sectional diagram of a conventional wide band-gap power MOSFET 100 that is similar to the power MOSFET disclosed in U.S. Pat. No. 9,012,984 ("the '984 patent"). The entire content of the '984 patent is incorporated herein by reference.

As shown in FIG. 1, the power MOSFET 100 includes an n-type silicon carbide substrate 110. An n-type silicon carbide drift region 120 is provided on the substrate 110. A moderately-doped p-type silicon carbide layer (e.g., doping concentration of $1 \times 10^{17}$ to $5 \times 10^{18}$ dopants/cm$^3$) is formed on the upper surface of the of the n-type drift region 120. Gate trenches 180 are formed that penetrate the moderately-doped p-type silicon carbide layer to divide the moderately-doped p-type silicon carbide layer into a plurality of p-wells 170. A gate insulating layer 182 is formed on the bottom surface and sidewalls of each gate trench 180. A gate electrode 184 is formed on each gate insulating layer 182 to fill the respective gate trenches 180. The portion of the moderately-doped p-type silicon carbide layer (i.e., the layer that is used to form the p-wells 170) that extends into a termination region of the device is removed via a selective etch for effective operation of the termination, and an insulating layer 186 may be formed in its place.

Spaced apart p-type silicon carbide regions 140 are formed through the p-wells 170 into the upper surface of the n-type drift region 120 by ion implantation. Spaced apart p-type silicon carbide guard rings 150 (or other termination structures) are formed in the termination region of the device 100. The regions 140 and 150 may be more heavily-doped p-type than the moderately-doped p-wells 170. The portions of the p-type silicon carbide regions 140 that extend into the n-type drift region 120 may act as shielding regions that protect the gate insulating layer 182 from high electric fields during reverse blocking operation.

Heavily-doped (n$^+$) n-type silicon carbide source regions 174 are formed in upper portions of the p-wells 170 via ion implantation. Source contacts 190 are formed on the heavily-doped n-type source region 174 and on the p-wells 170. A drain contact 192 is formed on the lower surface of the substrate 110. A gate contact (not shown) may be formed on each gate electrode 174.

Several problems may arise in the above-described power MOSFET 100. First, the p-wells 170 are typically doped during epitaxial growth. As discussed above, in silicon carbide and various other wide band-gap semiconductor materials, it may be difficult to maintain a consistent doping concentration when doping during epitaxial growth, and variations in the doping levels from desired dopant concentrations may result in degraded device performance and/or an increase in the likelihood of device failure. Additionally, when doping during growth it is not possible to perform local tailoring of the dopant concentrations within the grown layer unless multiple growth and etching steps are performed, which generally is not commercially practical for most applications.

Second, the above-described approach requires removal of the portion of the epitaxially grown moderately doped p-type layer that is grown to form the p-wells 170 that extends into the termination region of each device on a wafer. This etching step is typically referred to as mesa etching. Not only does this involve an added processing step, it also may leave micron-sized steps or roughness in the wafer surface. Moreover, uncertainty in the amount of etching that occurs during the mesa etch can result in partial or even complete removal of one of more of the termination structures, and over-etching and/or under-etching can adversely affect the charge levels in the termination structure. The performance of the termination structures may be very sensitive to charge levels, and hence over-etching and/or under-etching can significantly degrade the performance of the termination structures and increase the likelihood of leakage currents and/or device failure.

Pursuant to embodiments of the present invention, gate trench wide band-gap power semiconductor devices such as power MOSFETs and power IGBTs are provided that have deep trench shielding regions and buried termination structures. In example embodiments, the termination structures may be buried under a lightly-doped p-type or n-type semiconductor layer. The deep trench shielding regions and the termination structures may be formed by ion implantation into the upper surface of a drift region/current spreading layer of the device, and the lightly-doped p-type or n-type semiconductor layer may then be grown on top of the structure after implantation, and one or more additional implantation steps may be performed to form the well regions and the highly-doped source regions.

The gate trench power semiconductor devices according to embodiments of the present invention may exhibit a number of advantages as compared to conventional devices. For example, as the well regions may be formed via ion implantation instead of via doping during epitaxial growth, the doping levels may be maintained closer to a desired doping level. Additionally, because the deep trench shielding regions and junction termination structures are formed prior to the formation of the well regions, the ions need not be implanted as deeply into the device structure, and hence can be implanted at lower implantation energies. This may reduce ion implantation damage to the semiconductor layers and may improve the accuracy and consistency of the implantation.

Additionally, the provision of the epitaxially grown lightly-doped semiconductor layer on the termination structures may lower surface fields in the termination region of the device. Moreover, since the semiconductor layer that is grown above the termination structures may be only lightly doped (or even undoped), it may not significantly affect the charge levels in the junction termination. As a result, the lightly-doped epitaxial layer may be left in place, and the mesa etch may be omitted in some embodiments. As discussed above, if over-etching or under-etching occurs during the mesa etch, the termination structures may be damaged and/or the charge levels in the termination structures may be adversely effected. If the mesa etch is omitted, these potential points for device degradation or failure may be removed. Moreover, when the lightly-doped epitaxial layer remains on the termination structures it may also serve as a protective layer.

Furthermore, in some cases it may be advantageous to vary the doping concentrations in the well regions along the horizontal cross-sections thereof. As discussed above, when the well regions are formed by doping during epitaxial growth such variation is typically not possible. However, since the well regions are formed by ion implantation, such variations may be provided by using multi-step implants with different implant masks. This may allow fine tailoring of the electrical properties of the channels of the power semiconductor device, which may improve the performance thereof. The power semiconductor devices according to embodiments of the present invention may be fabricated with less processing steps than conventional devices, and hence may be cheaper to make, and may allow for more tightly spaced pitch for the gate trenches, which may improve blocking performance.

The power semiconductor devices according to some embodiments of the present invention may have a semiconductor layer structure that includes an active region and a termination region. The semiconductor layer structure includes a drift region that may be formed of a wide band-gap semiconductor material such as silicon carbide. A shielding pattern may be formed in an upper portion of the drift region in the active region and a termination structure (e.g., guard rings or a junction termination extension) may be formed in the upper portion of the drift region in the termination region. The shielding pattern and the termination structure may be formed by ion implantation. The semiconductor layer structure may further include a semiconductor layer that extends above and at least partially covers the termination structure. A gate trench may be formed in an upper surface of the semiconductor layer structure. The gate trench may be formed through the semiconductor layer.

The power semiconductor devices according to additional embodiments of the present invention may have a semiconductor layer structure that includes a drift region that is formed of a wide band-gap semiconductor material doped with dopants having a first conductivity type. A gate trench may be formed in an upper surface of the semiconductor layer structure. First and second shielding patterns that are doped with dopants having a second conductivity type are formed in an upper portion of the drift region. First and second well regions that are doped with dopants having the second conductivity type are formed above the respective first and second shielding patterns on either side of the gate trench. A termination structure doped with dopants having the second conductivity type is also formed in the upper portion of the drift region. A portion of the first well region that is directly adjacent the first side of the gate trench comprises a first channel of the semiconductor device, the first channel having a lower concentration of the second conductivity type dopants than a remainder of the first well region.

Embodiments of the present invention will now be described with reference to FIGS. 2A-8. It will be appreciated that features of the different embodiments disclosed herein may be combined in any way to provide many additional embodiments.

Figure 2A:
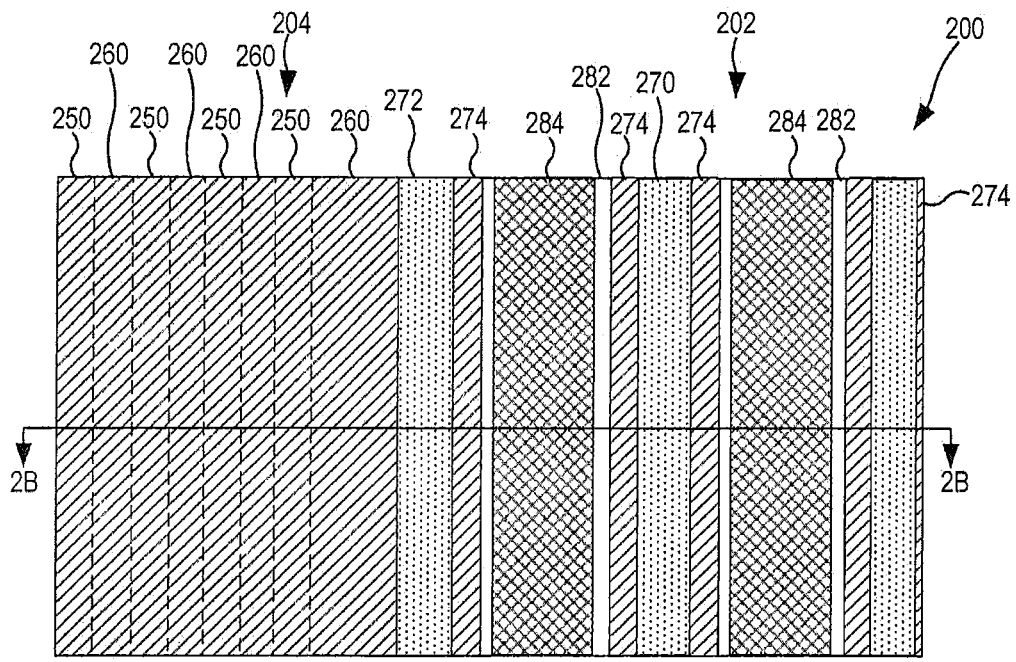
FIG. 2A is a schematic plan view of a portion of a gate trench power MOSFET having a buried edge termination according to embodiments of the present invention.
Figure 2B:
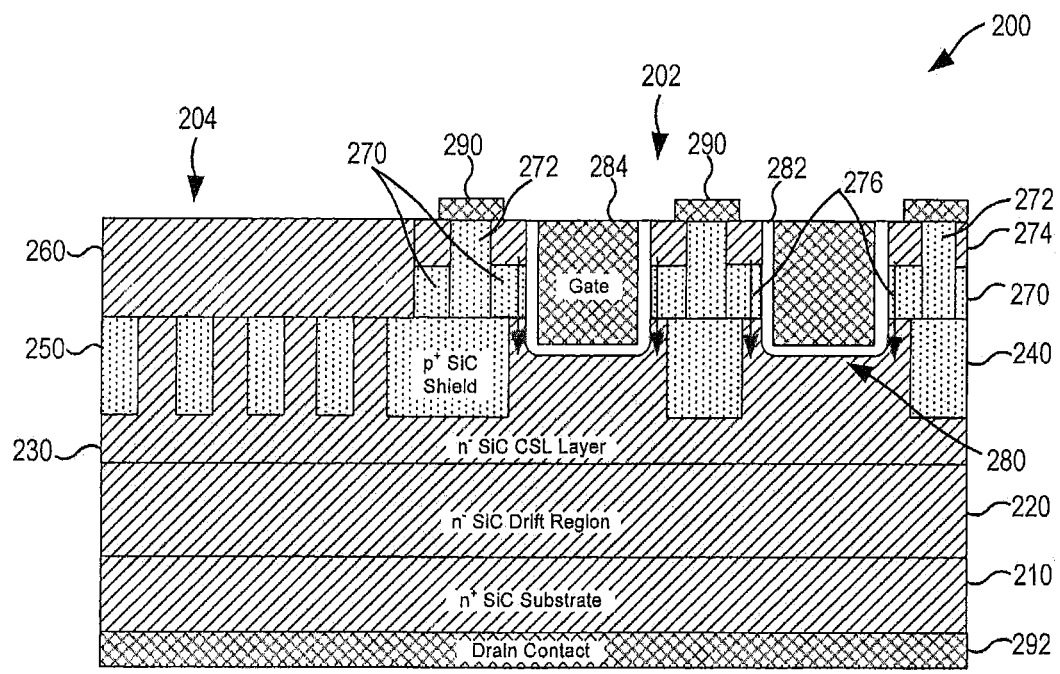
FIG. 2B is a schematic cross-sectional view of the gate trench power MOSFET of FIG. 2A taken along line 2B-2B of FIG. 2A.

FIG. 2A is a schematic plan view of a portion of a gate trench power MOSFET 200 having a buried edge termination according to embodiments of the present invention with the source contacts omitted to better show the underlying semiconductor layers. FIG. 2B is a schematic cross-sectional view of the gate trench power MOSFET 200 taken along line 2B-2B of FIG. 2A with the source contacts added. It will be appreciated that the specific layer structure, doping concentrations, materials, conductivity types and the like that are shown in FIGS. 2A-2B and/or described below are merely provided as examples to illustrate in detail the structure of a specific example embodiment. Thus, the specific details discussed below are not limiting to the present invention, which is described in the appended claims.

Referring to FIGS. 2A-2B, the power MOSFET 200 includes an active region 202 and a termination region 204 that surrounds the active region 202. The power MOSFET 200 may include a plurality of unit cells that are disposed in parallel. While FIGS. 2A-2B only depict a portion of a single power MOSFET 200, it will be appreciated that a plurality of power MOSFETs 200 may be grown on a single wafer. Approximately two unit cells and a portion of the termination region 204 are shown in FIGS. 2A-2B.

As shown in FIGS. 2A-2B, the power MOSFET 200 includes a heavily-doped (n+) n-type wide band-gap semiconductor substrate 210. The substrate 210 may comprise a single crystal 4H silicon carbide semiconductor substrate. The substrate 210 may be doped with n-type impurities (i.e., an n+ silicon carbide substrate). The impurities may comprise, for example, nitrogen or phosphorous. The doping concentration of the substrate 210 may be, for example, between $1\times10^{18}$ atoms/cm$^3$ and $1\times10^{21}$ atoms/cm$^3$, although other doping concentrations may be used. The substrate 210 may be any appropriate thickness (e.g., between 100 and 500 microns thick).

A lightly-doped (n−) silicon carbide drift region 220 is provided on the substrate 210. The silicon carbide drift region 220 may be formed by epitaxial growth on the silicon carbide substrate 210. The silicon carbide drift region 220 may have, for example, a doping concentration of $1\times10^{16}$ to $5\times10^{17}$ dopants/cm$^3$). The silicon carbide drift region 220 may be a thick region, having a vertical height above the substrate 210 of, for example, 3-100 microns. An upper portion of the silicon carbide drift region 220 may comprise an n-type silicon carbide current spreading layer ("CSL") 230. The n-type silicon carbide current spreading layer 230 may be grown in the same processing step as the remainder of the n-type silicon carbide drift region 220 and may be considered to be part of the silicon carbide drift region 220. The current spreading layer 230 may be a moderately-doped current spreading layer 230 that has a doping concentration (e.g., doping concentration of $1\times10^{17}$ to $5\times10^{18}$ dopants/cm$^3$) that exceeds the doping concentration of the remainder of the more lightly-doped n− silicon carbide drift layer 220.

Spaced apart p-type silicon carbide shielding regions 240 may then be formed in the upper surface of the n-type drift region 220/current spreading layer 230 in the active region 202 of the device 200. The shielding regions 240 may also be referred to as shielding patterns 240 herein. At the same time, spaced apart p-type silicon carbide guard rings 250 may be formed in the termination region 204 of the device 200. The p-type silicon carbide shielding regions 240 and the p-type silicon carbide guard rings 250 may extend to approximately the same depth into the drift layer 220/current spreading layer 230. In example embodiments, the depth may be about 1-2 microns, although other depths may be used. For example, depths of 0.5 to 3 microns may be used in other embodiments. Depths of 1.5 to 3 microns may be used in still other embodiments. The p-type silicon carbide shielding regions 240 and the p-type silicon carbide guard rings 250 may be formed by ion implantation into the upper surface of the n-type drift region 220/current spreading layer 230. As known to those skilled in the art, ions such as n-type or p-type dopants may be implanted in a semiconductor layer or region by ionizing the desired ion species and accelerating the ions at a predetermined kinetic energy as an ion beam towards the surface of a semiconductor layer in an ion implantation target chamber. Based on the predetermined kinetic energy, the desired ion species may penetrate into the semiconductor layer to a certain depth.

The guard rings 250 are formed in the termination region 204 to surround the active region 202. While the guard rings 250 are not visible in FIG. 2A as they are underneath the silicon carbide layer 260 (described below), the locations of the guard rings 250 are shown in FIG. 2A by the dotted rectangles labelled 250. It will be appreciated that only a portion of the guard rings 250 are shown in FIG. 2A, as FIGS. 2A-2B only depict a portion of the MOSFET 200. In the full MOSFET 200, the guard rings 250 may comprise concentric rounded rectangles that enclose the active region 202 when viewed in plan view. The guard rings 250 may comprise edge termination structures. When a power semiconductor device such as the power MOSFET 200 is operated in the blocking state, leakage currents may begin to flow at the edges of the active region as the voltage is increased. Leakage currents tend to flow in these edge regions because electric field crowding effects at the edge of the device may result in increased electric fields in these regions. If the voltage on the device is increased past the breakdown voltage to a critical level, the increasing electric field may result in runaway generation of charge carriers within the semiconductor device, leading to avalanche breakdown. When avalanche breakdown occurs, the current increases sharply and may become uncontrollable, and an avalanche breakdown event may damage or destroy the semiconductor device.

In order to reduce this electric field crowding (and the resulting increased leakage currents), edge termination structures such as the guard rings 250 may be provided that surround part or all of the active region 202 of the power MOSFET 200. These edge termination structures may be designed to spread the electric field out over a greater area, thereby reducing the electric field crowding. Guard rings are one known type of edge termination structure. As shown in FIGS. 2A-2B, the guard rings 250 may comprise spaced-apart p-type trenches. While FIGS. 2A and 2B illustrate a power MOSFET 200 that uses four guard rings 250 as an edge termination structure, it will be appreciated that different numbers of guard rings 250 may be used, and that other edge termination structures may be used. For example, in other embodiments, the guard rings 250 may be replaced with a junction termination extension. It will also be appreciated that the edge termination structure may be omitted in some embodiments.

A lightly doped n-type or p-type (or undoped) silicon carbide layer 260 is provided on the upper surface of the of the n-type drift region 220/current spreading layer 230 and on the p-type silicon carbide shielding regions 240 and the p-type silicon carbide guard rings 250. The silicon carbide layer 260 may formed by epitaxially growth. In some embodiments, the silicon carbide layer 260 may have a doping concentration of, for example, less than $1\times10^{16}/cm^3$. In other embodiments, the silicon carbide layer 260 may have a doping concentration of less than $1\times10^{15}/cm^3$. P-wells 270 may be formed in the lightly doped n-type or p-type (or undoped) silicon carbide layer 260 above the p-type silicon carbide shielding regions 240. The p-wells 270 may comprise moderately-doped p-type silicon carbide regions that are formed in the lightly doped n-type or p-type (or undoped) silicon carbide layer 260. The p-wells 270 may have a doping concentration of, for example, between $5\times10^{16}/cm^3$ and $5\times10^{17}/cm^3$. In some embodiments, the p-wells 270 may be formed by ion implantation. An upper portion 272 of each p-well may be more heavily doped with p-type dopants. The upper portion 272 of each p-well 270 may have a doping concentration of, for example, between $2\times10^{17}/cm^3$ and $1\times10^{20}/cm^3$. The more heavily doped portion 272 of each p-well 270 (which have the same conductivity type as the remainder of the p-wells 270 and a conductivity opposite the conductivity type of the source regions 274, which are discussed below) may extend to the upper surface of the lightly-doped silicon carbide layer 260. As shown in FIG. 2B, in some embodiments, the more heavily doped portion 272 of the p-well 270 may extend downwardly to contact the p-type silicon carbide shielding regions 240. The more heavily-doped portions 272 of the p-wells 270 may provide a good electrical connection between the source contact 290 (described below) and the p-type shielding regions 240. The p-wells 270 (including the more heavily-doped upper portions 272 thereof) may be formed by ion implantation. The n-type silicon carbide substrate 210, n-type silicon carbide drift region 220/current spreading layer 230, the p-type silicon carbide shielding regions 240, the p-type silicon carbide guard rings 250, the lightly-doped silicon carbide layer 260 and the p-wells 270 (including the regions 272, 274 formed therein that are discussed below) may together comprise a semiconductor layer structure of the semiconductor device 200.

Gate trenches 280 are formed in the silicon carbide layer 260 (or in the p-wells 270, if the p-wells are formed by a blanket implantation step throughout the active region 202). The gate trenches 280 may also extend into the upper surface of the of the n-type drift region 220/current spreading layer 230. The gate trenches 280 may have a U-shaped cross-section in some embodiments, as shown in FIG. 2B. The rounding of the bottom edges of the gate trench 280 provided with the U-shaped cross-section may help reduce the electrical fields at the bottom corners of the gate trenches 280. The rounded corners may be omitted in some embodiments. A gate insulating layer 282 such as a silicon oxide layer is formed on the bottom surface and sidewalls of each gate trench 280. A gate electrode 284 is formed on each gate insulating layer 282. Each gate electrode 284 may fill the remainder of its respective gate trench 280. The gate electrodes 284 may comprise, for example, a semiconductor gate electrode or a metal gate electrode. The orientation, size and shape of the gate trenches 280 may be selected to provide a desired balance between the channel resistance in the on-state and the voltage blocking performance in the off-state.

Heavily-doped ($n^+$) n-type silicon carbide source regions 274 may be formed in upper portions of the p-wells 270. The n-type source regions 274 may be formed by ion implantation. Each n-type source region 274 may be directly adjacent and contacting a respective one of the more heavily doped portions 272 of the p-wells. The heavily-doped ($n^+$) n-type silicon carbide regions 274 act as the source regions for the individual transistors included in the unit cells. The drift region 220/current spreading layer 230 and the substrate 210 together act as a common drain region for the power MOSFET 200.

Source contacts 290 may be formed on the heavily-doped n-type source region 274 and the more heavily-doped portions 272 of the p-wells. The source contacts 290 may all be electrically connected to form a single source contact. The source contacts 290 may comprise, for example, metals such as nickel, titanium, tungsten or aluminum, or alloys or thin layered stacks of these or similar materials. A drain contact 292 may be formed on the lower surface of the substrate 210. The drain contact 292 may comprise, for example, similar materials to the source contact, as this forms an ohmic contact to the silicon carbide substrate. A gate contact (not shown) may be electrically connected to each gate electrode 274.

Vertical channel regions 276 are formed in the p-wells 270 adjacent the gate insulating layer 282. Current may flow from the n-type source regions 274 through the channel regions 276 to the drift region 220/current spreading layer 230 when a voltage is applied to the gate electrodes 284, as shown by the arrows in FIG. 2B.

The portion of the lightly-doped silicon carbide layer 260 that is in the termination region 204 may not be implanted. In an example embodiment, a doping concentration of the lightly-doped silicon carbide layer 260 in the termination region 204 may be between $1 \times 10^{15}/cm^3$ and $1 \times 10^{16}/cm^3$. In other embodiments, the doping concentration of the lightly-doped silicon carbide layer 260 in the termination region 204 may be less than $1 \times 10^{15}/cm^3$. The portion of the lightly-doped silicon carbide layer 260 that is in the termination region 204 may be above the guard rings 250 and may protect the guard rings 250.

The p-type silicon carbide shielding regions 240 may extend close to the gate trenches 280. A small section of the drift region 220/current spreading layer 230 may be between the gate trench 280 and an adjacent p-type silicon carbide shielding region 240. These small sections serves as current paths to the drain contact 292 for current flowing through the respective channels 276. The p-type silicon carbide shielding regions 240 may help reduce the extent to which the electric field that forms in the drift region 220 when the device is operated in the reverse blocking state extends upward toward the channel regions 276. The electric field, if too high, may over time degrade lower portions of the gate insulating layers 282, which may eventually result in device failure.

The p-wells 270 and the lightly-doped silicon carbide layer 260 have the same thickness in the vertical direction in the embodiment of FIGS. 2A-2B. This need not be the case. In other embodiments, the lightly-doped silicon carbide layer 260 may be thicker than the p-wells 270. In still other embodiments, the lightly-doped silicon carbide layer 260 may be thinner than the p-wells 270. An upper surface of the lightly-doped silicon carbide layer 260 in the termination region 204 may be coplanar with upper surfaces of the respective p-wells 270 in some embodiments.

Figure 2C:
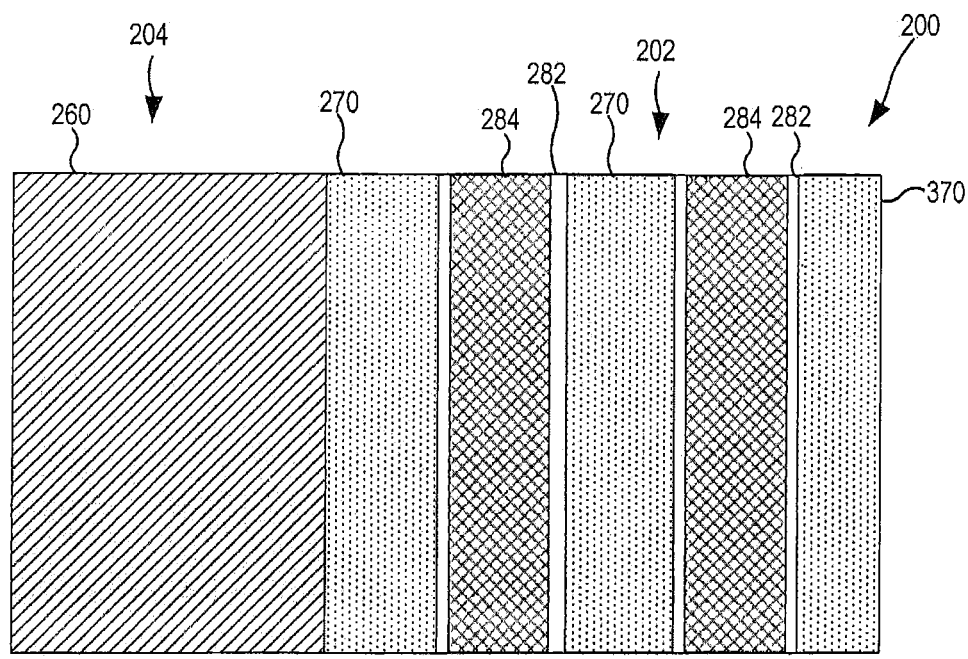
FIG. 2C is a partial horizontal cross-section taken through the power MOSFET of FIG. 2A that illustrates the shape of the p-wells thereof.

FIG. 2C is a horizontal cross-section through the power MOSFET 200 (i.e., a cross section taken parallel to the bottom surface of the substrate 210) that is taken through a lower portion of the p-wells 270. As shown in FIG. 2C, the p-wells 270 may be formed by performing a blanket implant of p-type dopants into the lightly-doped silicon carbide layer 260. The p-wells 270 may be formed in example embodiments prior to the gate trenches 280, so the gate trenches 280 may be etched through the silicon carbide layer 260 after the blanket implant is performed in order to divide the implanted layer into the plurality of p-wells 270. As can be seen in FIG. 2C, the blanket implant that forms the p-wells 270 does not extend into the termination region 204 of the MOSFET 200.

Referring to FIGS. 2A-2C, it can be seen that the heavily-doped shielding regions 240, the heavily-doped portions 272 of the p-wells 270, the source regions 274, the vertical channels 276, the gate trenches 280, the gate insulating layers 282 and the gate electrodes 284 may all extend in parallel stripes in the same direction. As noted above, the p-wells 270 may be formed by a blanket implant throughout the active region 202.

The power MOSFET 200 may exhibit several advantages over conventional power MOSFET designs. First, as described above, the lightly-doped epitaxial layer 260 may be left in place in the completed device. As such, it may serve to protect the termination structures such as the guard rings 250, and may also lower surface fields in the termination region 204 of the device. Second, since the need for a mesa etch may be eliminated, over-etching or under-etching in the termination region 204 may be avoided that can adversely affect the performance of the termination structures 250. Third, since the p-wells 270 are formed via ion implantation, the doping levels may be maintained closer to a desired doping level than is possible when the p-wells 270 are formed via an epitaxial growth process. Fourth, because the deep trench shielding regions 240 and termination structures 250 are formed prior to the formation of the p-wells 270, the ions need not be implanted as deeply into the device structure, and hence can be implanted at lower implantation energies, which may reduce ion implantation damage and/or improve the accuracy and consistency of the implantation. Fifth, since the p-wells 270 are formed via ion implantation, the doping concentrations in the p-wells 270 may be varied along the horizontal cross-sections thereof. This may allow fine tailoring of the electrical properties of the channels of the power semiconductor device, which may improve the performance thereof. Sixth, the power semiconductor devices according to embodiments of the present invention may be fabricated with less processing steps than conventional devices, and hence may be cheaper to make, and may allow for more tightly spaced pitch for the gate trenches, which may improve blocking performance.

Figure 3A:
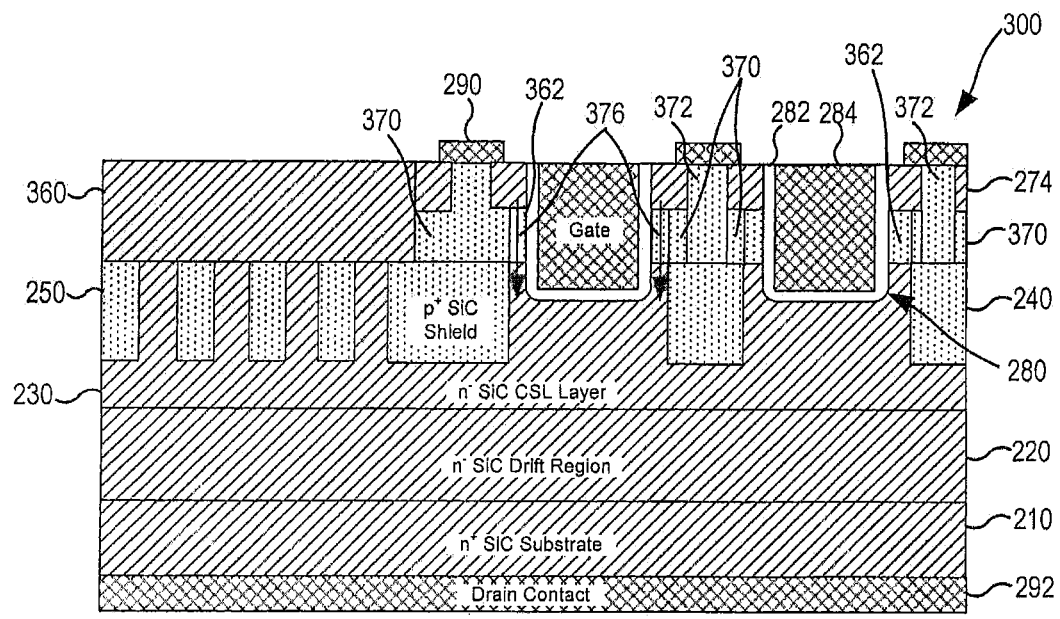
FIG. 3A is a schematic cross-sectional diagram of a portion of a gate trench power MOSFET according to further embodiments of the present invention that includes non-uniformly doped well regions.

FIG. 3A is a schematic cross-sectional diagram of a gate trench power MOSFET 300 according to further embodiments of the present invention that includes a non-uniformly doped well region. As the power MOSFET 300 is similar to the power MOSFET 200 discussed above with reference to FIGS. 2A-2B, like elements of power MOSFET 300 are numbered using the same reference numerals, and will not be discussed further below as they have already been described above. The discussion that follows will focus on the differences between the power MOSFET 300 and the power MOSFET 200.

As shown in FIG. 3A, the power MOSFET 300 includes a lightly-doped silicon carbide layer 360 and p-wells 370 that differ from the corresponding elements of the power MOSFET 200 of FIGS. 2A-2B. In particular, in the power MOSFET 300, the lightly-doped silicon carbide layer 360 is formed as a lightly doped p-type silicon carbide layer 360. The lightly-doped p-type silicon carbide layer 360 may be formed via epitaxial growth and may be doped during growth. The p-wells 370 that are formed in the lightly-doped p-type silicon carbide layer 360 may have a different shape as compared to the p-wells 270 of power MOSFET 200. In particular, the p-wells 370 do not extend all the way to the gate trench 280, but instead, each p-well 370 is spaced apart from the gate insulating layer 282 by a respective portion 362 of the lightly-doped p-type silicon carbide layer 360. The portion 362 of the lightly-doped p-type silicon carbide layer 360 may comprise the channels 376 of the power MOSFET 300. Thus, each channel 376 may be between one of the p-wells 370 and one of the gate trenches 280. It should be noted that the channels 376 are p-type channels, since the lightly-doped silicon carbide layer 360 is a p-type silicon carbide layer. The channels 376, however, may be more lightly doped than the p-wells 370 and hence are considered to be different than the p-wells 370.

The p-wells 370 may be formed by a selective ion implantation into the lightly-doped p-type silicon carbide layer 360 that does not implant p-type ions into the portions 362 of the lightly-doped p-type silicon carbide layer 360. Each p-well 370 may still include a more heavily doped portion 372 in a middle thereof that may extend upwardly to contact a respective one of the source contacts 290.

By only forming the p-wells 370 in the regions of the lightly-doped p-type silicon carbide layer 360 that are spaced apart from the gate trenches 282 it may be possible to achieve channels 376 that have better properties. In particular, the p-wells 370 may be more highly doped than the p-wells 270 of the power MOSFET 200 since the channels 376 are not formed in the p-wells 370. The higher p-type dopant concentrations in the p-wells 370 may improve the electric field blocking properties of the power MOSFET 300 in the blocking state by reducing barrier lowering when high electric fields are formed in the drift region 220 and the current spreading layer 230. The lower doping in the channels 376 helps maintain high electron mobility in the channels 376, which lowers the on-state resistance of the power MOSFET 300. Since the p-wells 370 are formed by ion implantation as opposed to epitaxial growth (as is the case in the power MOSFET 100 that is discussed above), the lower doped channels 376 may be easily formed during the fabrication process.

In the power MOSFET 300 of FIG. 3A, the p-wells 370 have bar shapes that extend into the diagram. Accordingly, in a horizontal cross-section (i.e., in a cross-section taken in a plane parallel to an upper surface of the substrate 210) of the power MOSFET 300 taken through the p-wells 370, the p-wells 370 will appear as a series of spaced apart stripes that extend in parallel to each other and in parallel to the gate trenches 280. This is shown in FIG. 3B, which is a horizontal cross-section through the power MOSFET 300 that is taken through a lower portion of the p-wells 370.

Figure 3B:
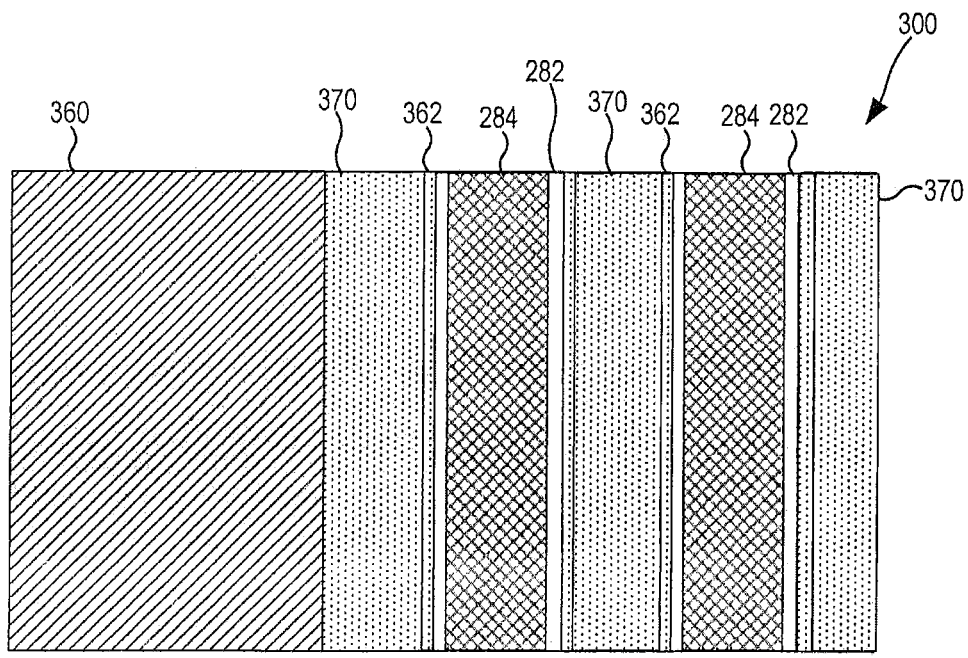
FIG. 3B is a partial horizontal cross-section taken through the power MOSFET of FIG. 3A that illustrates the shape of the p-wells thereof.
Figure 4A:
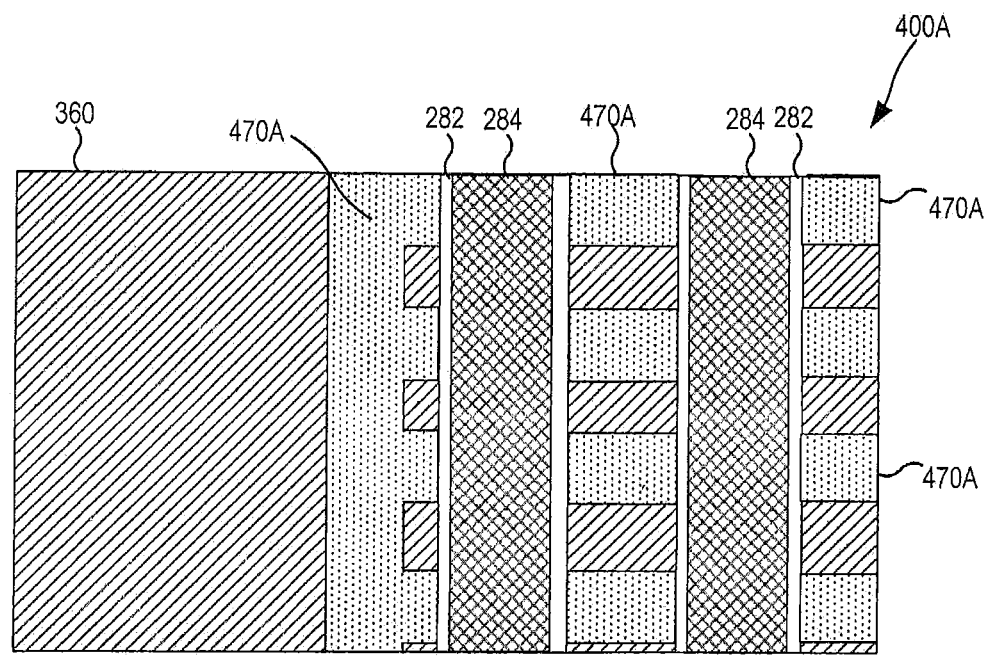
FIGS. 4A-4B are partial horizontal cross-sections of modified versions of the power MOSFET of FIG. 3A-3B that have p-wells with different shapes.
Figure 4B:
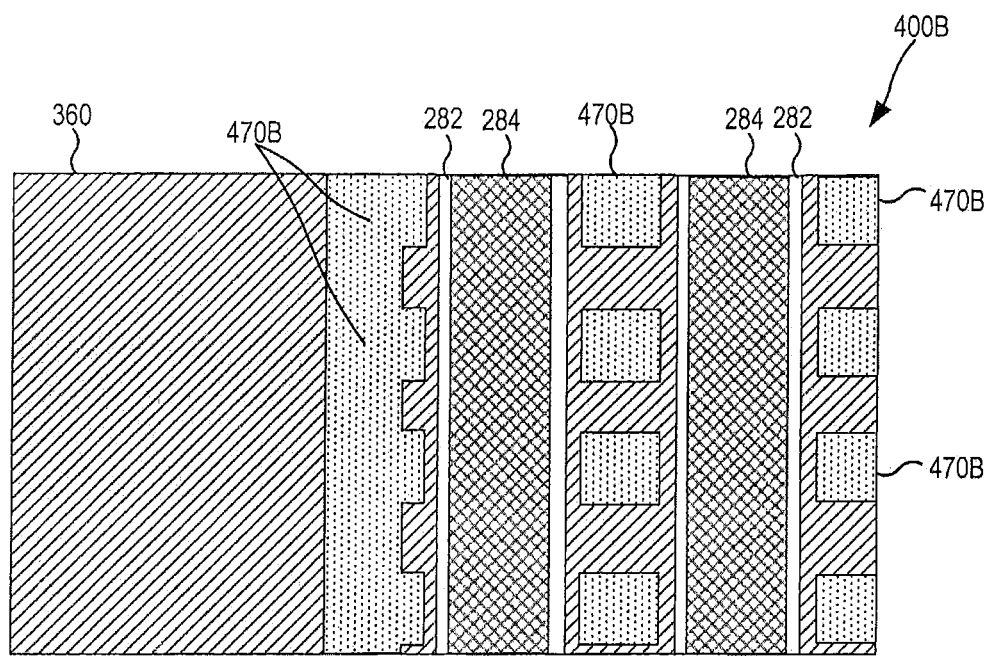

It will be appreciated, however, that the p-wells 370 of the power MOSFET 300 of FIGS. 3A-3B may be replaced with p-wells having a wide variety of different shapes. For example, FIG. 4A illustrates a power MOSFET 400A that is a slightly modified version of power MOSFET 300. As noted above, the power MOSFET 300 has p-wells 370 that are formed in stripes that extend in parallel to the gate trenches 380. The power MOSFET 400A has p-wells 470A that are formed in stripes that extend perpendicular to the gate trenches 280. The gaps between the p-well 470A stripes can be adjusted to leave an optimal amount of low-doped silicon carbide in the channel region to help increase channel mobility, which may help lower the on-state resistance of the device, while still blocking high electric fields in the off-state. FIG. 4B illustrates a power MOSFET 400B that is another slightly modified version of power MOSFET 300 that has p-wells 470B that are formed as square dots. Other shaped "dots" may be used. The gaps between adjacent ones of the p-well dots 470B, and the gaps between the p-well dots 470B and the gate trenches 280, may be adjusted to leave a desired or optimal amount low-doped silicon carbide to help increase channel mobility, which may help lower the on-state resistance of the device, while still blocking high electric fields in the off-state These alternative geometric layouts allow a greater packing density of MOS channels, which lowers the specific on-resistance of the device. Thus, devices can be made smaller for a given resistance specification, or more current can flow through a device with a given area.

All of the MOSFET designs disclosed herein may be applied to MOSFETs that have more complex gate trench layouts in place of the simple striped gate trench layouts included in the MOSFETs depicted in FIGS. 2A-4B. For example, MOSFETs that replace the striped gate trench design with a criss-crossed array of gate trenches that form a screen pattern may also be provided according to further embodiments of the present invention. Likewise, in other embodiments, the gate trenches may be disposed in hexagonally oriented stripes (when viewed in plan view) to form a hexagonal trench pattern, and the techniques according to embodiments of the present invention may be applied to form implanted p-wells and low-doped regions near the channel regions.

Figure 5:
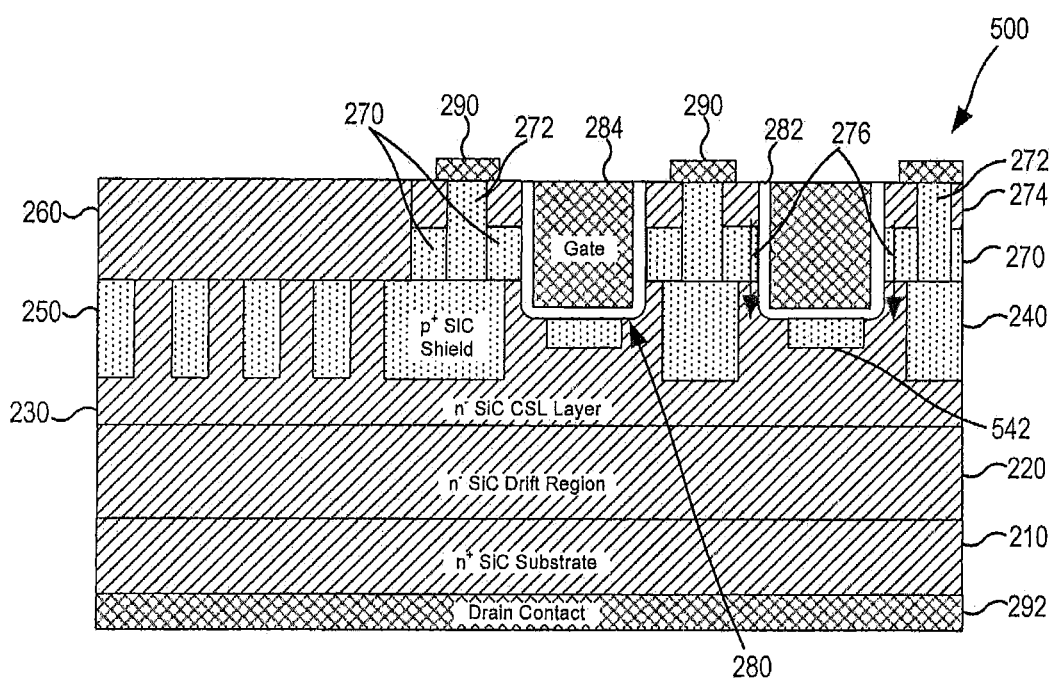
FIG. 5 is a schematic cross-sectional diagram of a portion of a gate trench power MOSFET according to still further embodiments of the present invention that includes a shield directly under each gate trench.

FIG. 5 is a schematic cross-sectional diagram of a gate trench power MOSFET 500 according to still further embodiments of the present invention that includes a shield directly under each gate trench. As the power MOSFET 500 is similar to the power MOSFET 200 discussed above with reference to FIGS. 2A-2C, like elements of power MOSFET 500 are numbered using the same reference numerals, and will not be discussed further below as they have already been described above. The discussion that follows will focus on the differences between the power MOSFET 500 and the power MOSFET 200.

As shown in FIG. 5, the power MOSFET 500 may be identical to the power MOSFET 200, except that the power MOSFET 500 includes a p-type silicon carbide shielding regions 542 underneath each of the gate trenches 280. The p-type silicon carbide shielding region 542 may further shield the gate insulating layers 282 from high electric fields during reverse blocking operation. The p-type silicon carbide shielding region 542 may be electrically connected to the p-type shielding regions 240. These electrical connections are not shown in FIG. 5, but may be implemented as buried connections within, for example, the drift region 220.

Figure 6A:
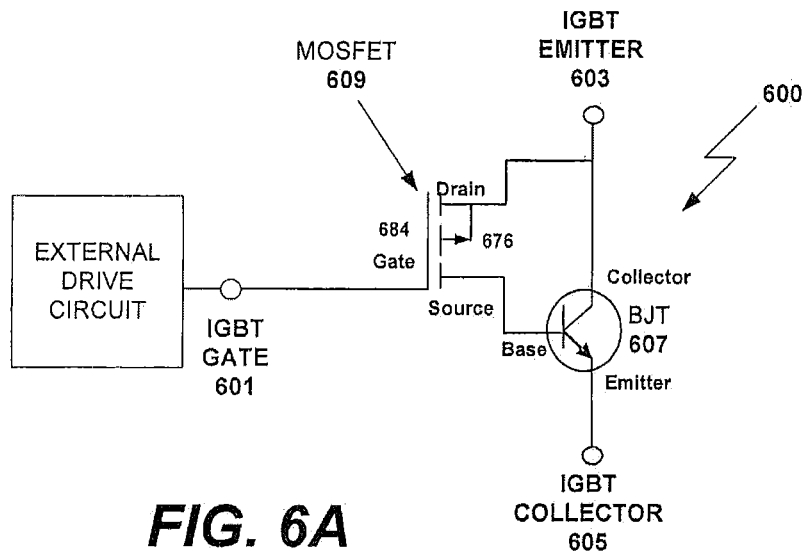
FIG. 6A is a simplified circuit diagram of an n-channel silicon carbide power insulated gate bipolar transistor ("IGBT") according to embodiments of the present invention.
Figure 6B:
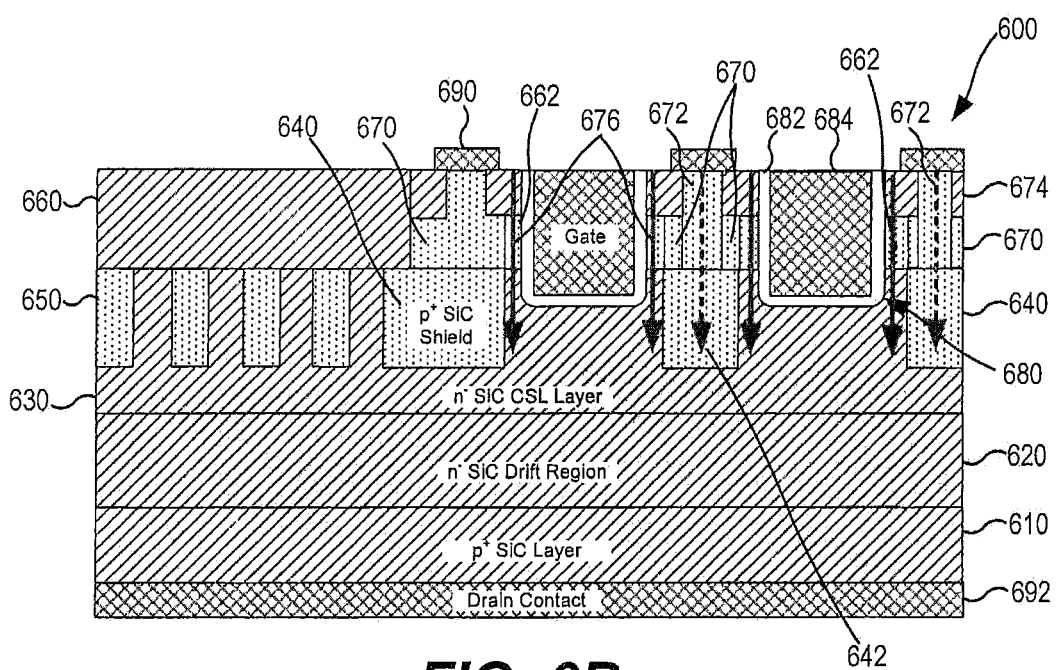
FIG. 6B is a schematic cross-sectional diagram of a unit cell of the IGBT of FIG. 6A.

FIG. 6A is a simplified circuit diagram of an n-channel silicon carbide power IGBT 600 according to embodiments of the present invention. FIG. 6B is a schematic cross-sectional diagram of the IGBT 600 of FIG. 6A.

As shown in FIG. 6A, the IGBT 600 includes an p-n-p silicon carbide power BJT 607 that has a base, an emitter and a collector. The IGBT 600 further includes a silicon carbide MOSFET 609 having a gate, a source and a drain. The source of the silicon carbide MOSFET 609 is electrically connected to the base of the silicon carbide power BJT 607, and the drain of the silicon carbide MOSFET 609 is electrically connected to the collector of the silicon carbide power BJT 607. By convention, the collector of the BJT 607 is the emitter 603 of the IGBT 600, and the emitter of the BJT 607 is the collector 605 of the IGBT 600, and the gate 684 of the MOSFET 609 is the gate 601 of the IGBT 600.

The IGBT 600 may operate as follows. An external drive circuit is connected to the gate 601 of the IGBT 600 for applying a gate bias voltage to the MOSFET 609. When this external drive circuit applies a voltage to the gate 601 of IGBT 600 that is greater than the threshold voltage of the MOSFET 609, an inversion layer is formed in a semiconductor layer that is beside the gate 601 which acts as a channel 676 that electrically connects the n$^+$ emitter 603 of the IGBT 600 to the base of BJT 607. Note that the gate 601 of IGBT 600 is the gate 684 of MOSFET 609. Electrons are injected from the n$^+$ emitter region 603 through the channel 676 into the base of BJT 607. This electron current acts as the base current that drives the BJT 607. In response to this electron current, holes are injected from the collector 605 of IGBT 600 across the base of BJT 607 to the emitter 603 of IGBT 600. Thus, the silicon carbide MOSFET 609 converts the silicon carbide power BJT 607 from a current driven device to a voltage driven device, which may allow for a simplified external drive circuit. The silicon carbide MOSFET 609 acts as a driver transistor, and the silicon carbide power BJT 607 acts as the output transistor of the IGBT 600.

FIG. 6B is a schematic cross-sectional diagram of a portion of the IGBT 600 of FIG. 6A that illustrates a pair of unit cells of the power IGBT 600 and an edge termination region thereof. It will be appreciated that to form the power IGBT 600, typically a large number of unit cells are implemented in parallel.

As shown in FIG. 6B, the IGBT 600 may be formed on, for example, a heavily-doped p-type silicon carbide layer 610. The p-type layer 610 may, for example, be epitaxially grown on a silicon carbide substrate and the substrate may thereafter be removed. The p+ layer 610 acts as the collector 605 of the IGBT 600 (and hence also as the emitter of the BJT 607). A lightly-doped n-type (n−) silicon carbide drift layer 620 is provided on the p-type layer 610. A moderately-doped n-type silicon carbide current spreading layer 630 is provided in the upper portion of the drift region 620. The n-type silicon carbide layers 620, 630 act as the base of the BJT 607 and as the source region of the MOSFET 609. The n-type silicon carbide layers 620, 630 may be formed via epitaxial growth.

Heavily-doped p-type silicon carbide shielding regions 640 are formed in the upper surface of the n-type current spreading layer 630 in the active region 602 of the device 600. Spaced apart p-type silicon carbide guard rings 650 may also be formed in the termination region 604 of the device 600. The p-type silicon carbide shielding regions 640 and the p-type silicon carbide guard rings 650 may extend to approximately the same depth into the current spreading layer 630, and may be formed by ion implantation into the upper surface of the n-type current spreading layer 630. The guard rings 650 may be replaced with other termination structures in other embodiments.

A lightly doped n-type or p-type (or undoped) silicon carbide layer 660 is provided on the upper surface of the of the n-type current spreading layer 630 and on the p-type silicon carbide shielding regions 640 and the p-type silicon carbide guard rings 650. The silicon carbide layer 660 may formed by epitaxial growth. P-wells 670 may be formed in the lightly doped n-type or p-type (or undoped) silicon carbide layer 660 above the p-type silicon carbide shielding regions 640. The p-wells 670 may comprise moderately-doped p-type silicon carbide regions that are formed in the silicon carbide layer 660. In some embodiments, the p-wells 670 may be formed by ion implantation. An upper portion of each p-well 670 may be more heavily doped with p-type dopants to form a heavily-doped p+ silicon carbide emitter region 672 (which also acts as the collector of the BJT 607). Heavily-doped (n+) n-type silicon carbide drain regions 674 may be formed in upper portions of the p-wells 670 adjacent the respective heavily-doped p-type silicon carbide emitter regions 672. Each n-type drain region 674 may be directly adjacent and contacting a respective one of the more heavily-doped p-type silicon carbide emitter region 672.

This n+ silicon carbide drain region 674 acts as a common drain for the IGBT 600. An ohmic contact 690 is formed to contact the p+ silicon carbide emitter region 672 and the n+ silicon carbide drain region 674, and an ohmic contact 692 is formed on the back side of the p+ silicon carbide layer 610.

Gate trenches 680 are formed in the silicon carbide layer 660. The gate trenches 680 may also extend into the upper surface of the n-type current spreading layer 630. The gate trenches 680 may have a U-shaped cross-section. A gate insulating layer 682 such as a silicon oxide layer is formed on the bottom surface and sidewalls of each gate trench 680. A gate electrode 684 that acts as the gate 601 of the IGBT 600 is formed on each gate insulating layer 682 to fill the respective gate trenches 680. The gate electrodes 684 may comprise, for example, a semiconductor gate electrode or a metal gate electrode. A gate contact (not shown) may be electrically connected to each gate electrode 684.

The p-wells 670 may not extend all the way to the gate trench 680, but instead, each p-well 670 may be spaced apart from the gate insulating layer 682 by a respective portion 662 of the lightly-doped p-type silicon carbide layer 660. The portion 662 of the lightly-doped p-type silicon carbide layer 660 may comprise the vertical channels 676 of the MOSFET 609 of power IGBT 600. Each channel 676 may be between one of the p-wells 670 and one of the gate trenches 680. The channels 676 may be made to be p-type channels by growing the lightly-doped silicon carbide layer 660 as a p-type silicon carbide layer. The channels 676, however, may be more lightly doped than the p-wells 670.

Vertical channel regions 676 of the MOSFET 609 are formed in the p-wells 670 adjacent the gate insulating layer 682 between the n+ drain region 674 and the n-type current spreading layer 630.

The portion of the lightly-doped silicon carbide layer 660 that is in the termination region 604 may not be implanted. In an example embodiment, a doping concentration of the lightly-doped silicon carbide layer 660 in the termination region 604 may be between $1\times10^{15}/cm^3$ and $1\times10^{16}/cm^3$. In another embodiment, a doping concentration of the lightly-doped silicon carbide layer 660 in the termination region 604 may be less than $1\times10^{15}/cm^3$.

Operation of the IGBT 600 will now be discussed. When a bias voltage that exceeds the threshold voltage of the MOSFET 609 is applied to the gate 601, an electron current flows across the channels 676 of MOSFET 609 into the base of the BJT 607, as indicated by the solid bold arrows in FIG. 6B. In response to this base current, a hole current (shown by the dashed arrows in FIG. 6B) flows from the heavily-doped p-type emitter region 672 of the IGBT 600 through the p-wells 670 to the collector 605 of the IGBT 600.

Figure 7A:
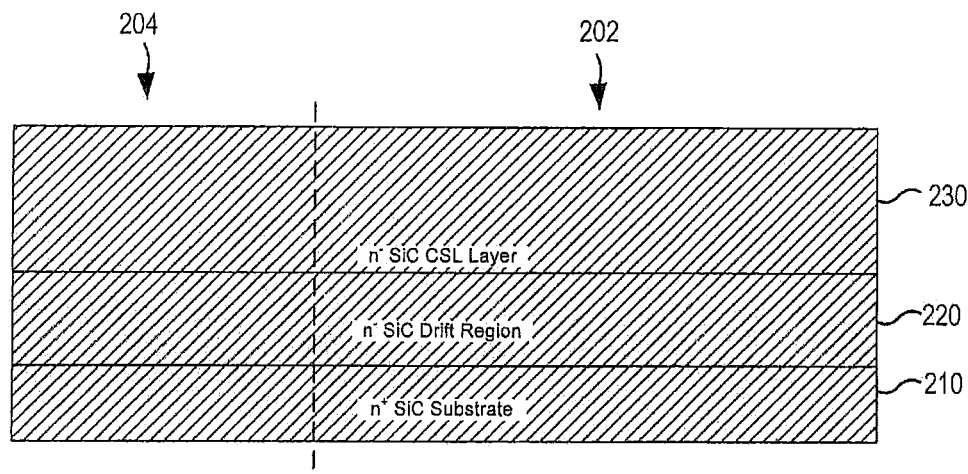
FIGS. 7A-7G are schematic cross-sectional diagrams that illustrate a method of fabricating the gate trench power MOSFET of FIGS. 2A-2C.

FIGS. 7A-7G are schematic cross-sectional diagrams that illustrate a method of fabricating the gate trench power MOSFET 200 of FIGS. 2A-2C. Referring first to FIG. 7A, a heavily-doped (n+) n-type silicon carbide substrate 210 is provided that includes a first portion that will correspond to an active region 202 of the power MOSFET and a second portion that will correspond to a termination region 204 that surrounds the active region 202. A lightly-doped (n−) silicon carbide drift region 220 is formed on the substrate 210 via epitaxial growth. An n-type silicon carbide current spreading layer 230 is formed that comprises the upper portion of the n− silicon carbide drift layer 220.

Figure 7B:
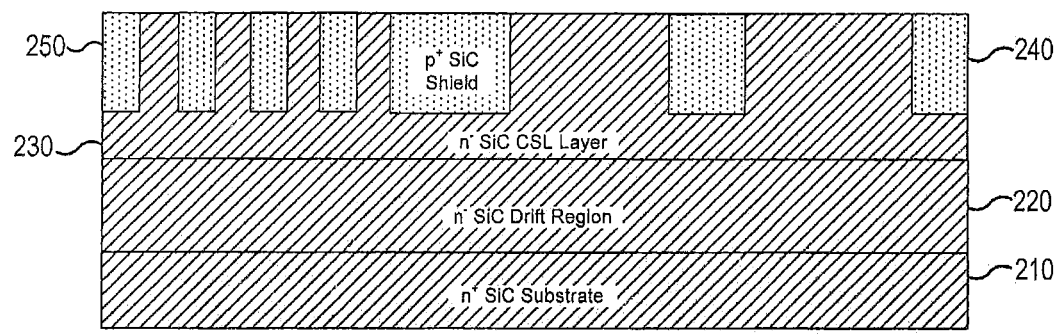

Referring to FIG. 7B, ion implantation may be used to form a plurality of spaced apart p-type silicon carbide shielding regions 240 in the active region 202 and a plurality of p-type silicon carbide guard rings 250 in the termination region 204. The p-type silicon carbide shielding regions 240 and the p-type silicon carbide guard rings 250 may be formed in the upper surface of the n-type current spreading layer 230 of the device 200 and may extend to approximately the same depth.

Figure 7C:
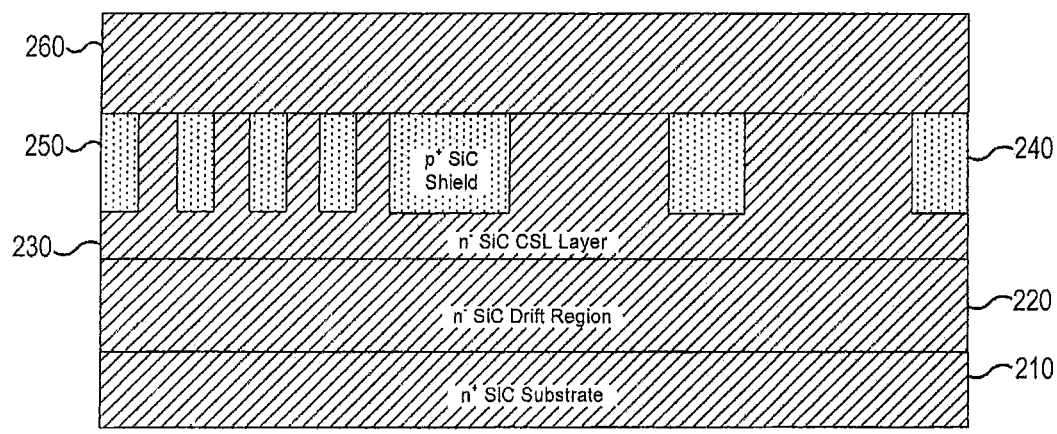

Referring to FIG. 7C, a lightly doped n-type silicon carbide layer 260 is formed on the upper surface of the of the n-type current spreading layer 230, on the p-type silicon carbide shielding regions 240 and the on p-type silicon carbide guard rings 250. The silicon carbide layer 260 may be formed by epitaxial growth.

Figure 7D:
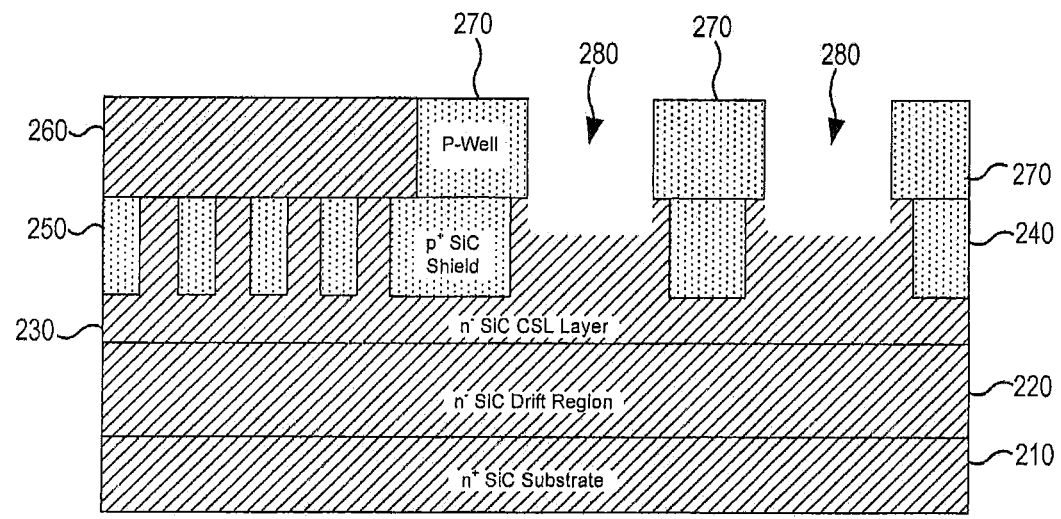

Referring to FIG. 7D, the portion of the silicon carbide layer 260 that is in the active region 202 is converted into a p-type silicon carbide region via ion implantation. Gate trenches 280 are then formed using standard photolithography and etching techniques in the p-type silicon carbide region. The formation of the gate trenches 280 converts the p-type silicon carbide region via into a plurality of p-wells 270. The gate trenches 280 extend into the upper surface of the of the n-type current spreading layer 230, and may have a U-shaped cross-section in some embodiments.

Figure 7E:
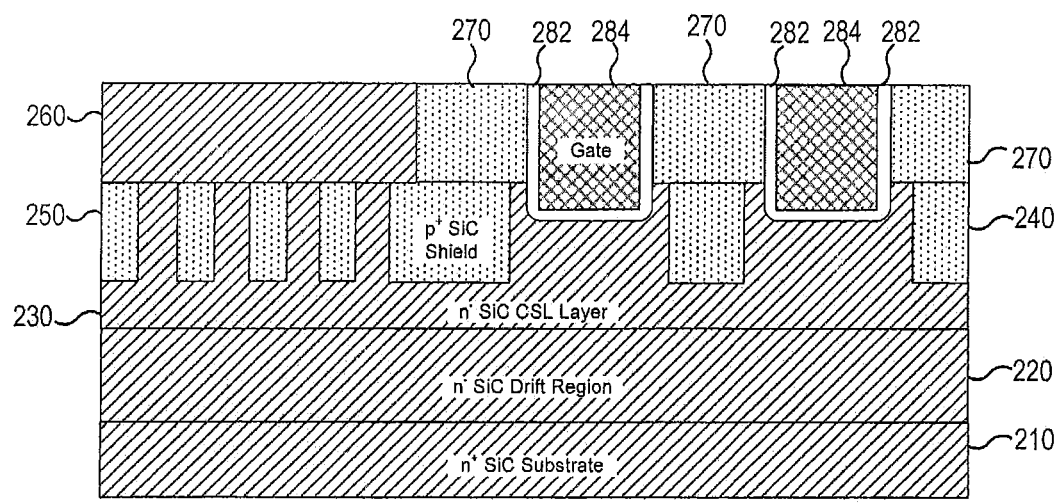

Referring to FIG. 7E, a gate insulating layer 282 such as a silicon oxide layer is formed on the bottom surface and sidewalls of each gate trench 280. A gate electrode 284 is formed on each gate insulating layer 282. Each gate electrode 284 may fill the remainder of its respective gate trench 280.

Figure 7F:
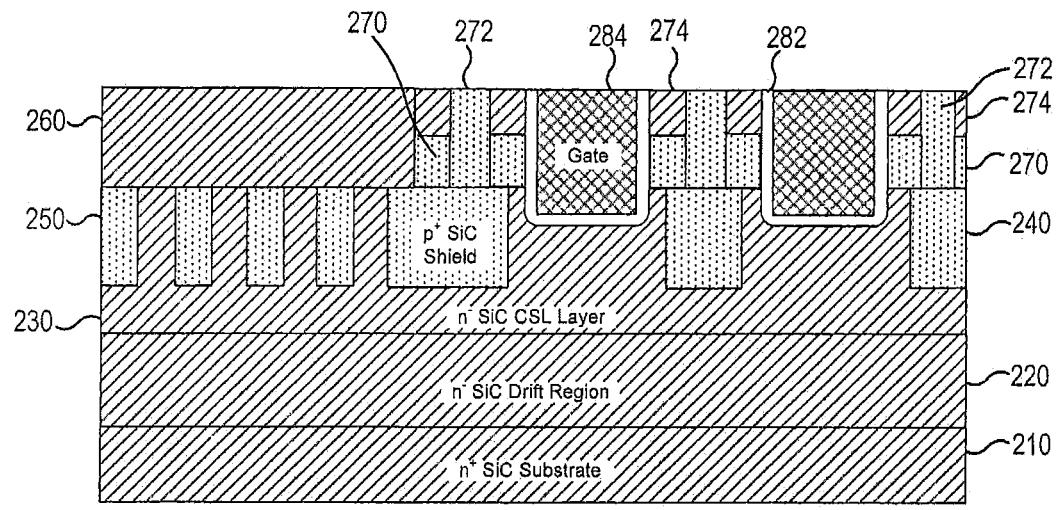

Referring to FIG. 7F, another ion implantation step may then be performed to more heavily dope a portion 272 of each p-well with p-type dopants. Another ion implantation step is then performed to form heavily-doped (n⁺) n-type silicon carbide source regions 274 in upper portions of the p-wells 270. In some embodiments, one or both of the ion implantation steps used to form the regions 272, 274 may be performed prior to formation of the gate trench, gate 280 insulating layer 282 and/or gate electrode 284.

Figure 7G:
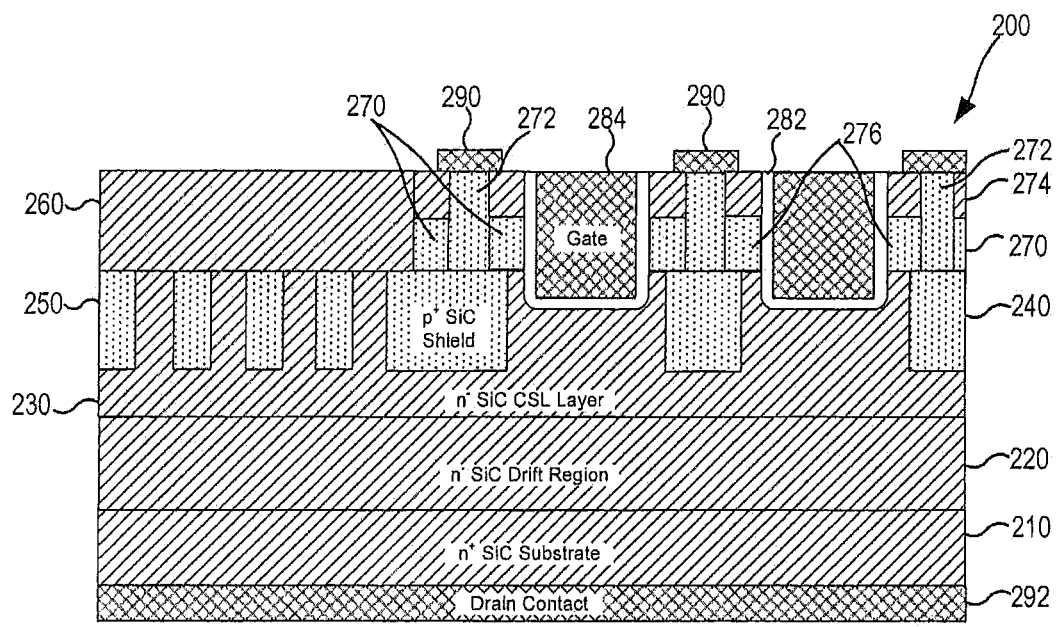

Referring to FIG. 7G, source contacts 290 are formed on the heavily-doped n-type source region 274 and the more heavily-doped portions 272 of the p-wells. A drain contact 292 is formed on the lower surface of the substrate 210. Vertical channel regions 276 are provided in the p-wells 270 adjacent the gate insulating layer 282.

Figure 8:
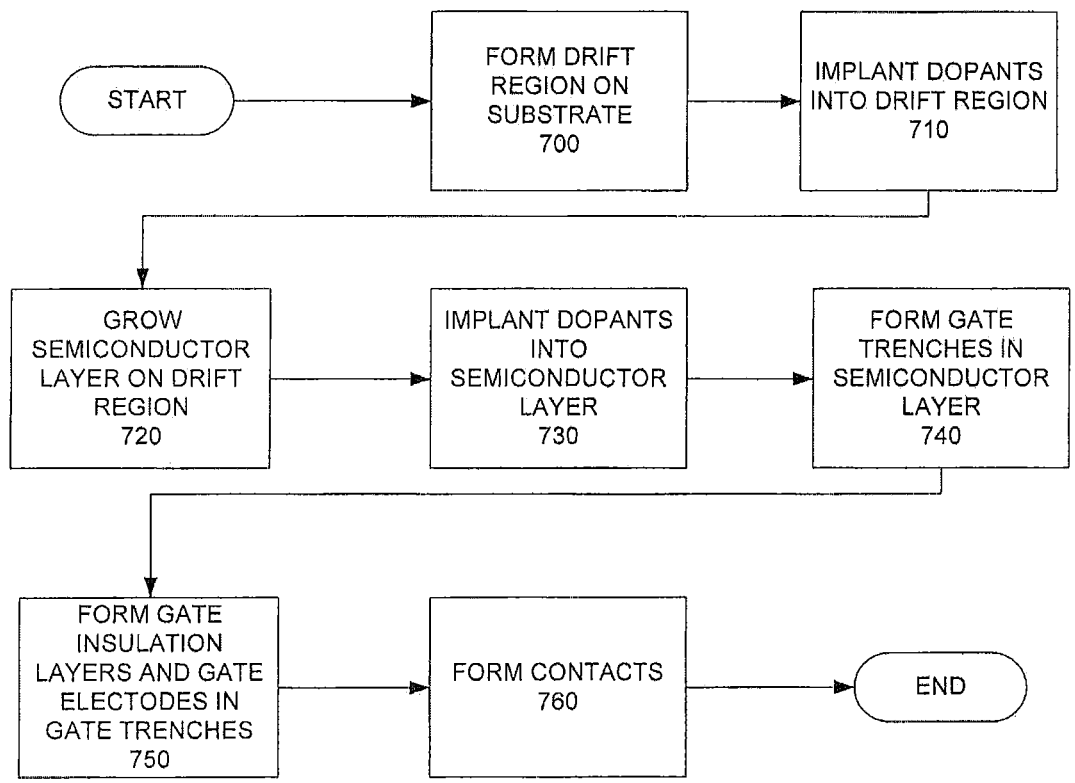
FIG. 8 is a flow chart that illustrates a method of fabricating a gate trench power semiconductor device having a buried edge termination according to embodiments of the present invention.

FIG. 8 is a flow chart that illustrates a method of fabricating a gate trench power semiconductor device having a buried edge termination according to embodiments of the present invention. As shown in FIGS. 7A and 8, operations may begin with the epitaxial growth of a wide band-gap semiconductor drift region on a semiconductor substrate (block 700). The drift region and the semiconductor substrate are each doped with dopants having a first conductivity type. The upper portion of the drift region may be more highly doped with the first conductivity type dopants to provide a current spreading layer in the upper portion of the drift region. Referring to FIGS. 7B and 8, second conductivity type dopants may next be implanted into an upper surface of the drift region (which may be a current spreading layer) to form a termination structure in a termination region of the semiconductor device and to form a shielding pattern in an active region of the semiconductor device (block 710). The second conductivity type is opposite the first conductivity type.

Referring to FIGS. 7C and 8, a lightly doped semiconductor layer (which may be undoped in some embodiments) may then be epitaxially grown on the upper surface of the drift region (block 720). In some embodiments, this semiconductor layer may have a dopant concentration of less than $1 \times 10^{16}/cm^3$ as grown, or a concentration of less than $1 \times 10^{15}/cm^3$ in other embodiments.

Referring to FIGS. 7D and 8, second conductivity type dopants may be implanted into the portion of the epitaxially grown semiconductor layer that is in the active region of the device (block 730). In some embodiments, the entire portion of the semiconductor layer that is in the active region may be implanted, while in other embodiments selective implants into the active region may be used instead. Then, gate trenches may be formed in the implanted semiconductor layer in the active region (block 740). The gate trenches may be formed using standard photolithography and etching techniques. These gate trenches may extend into the upper surface of the drift region, and may have rounded bottom corners in some embodiments. The formation of the gate trenches acts to define a plurality of second conductivity type wells in the active region above the drift region.

Referring to FIGS. 7E and 8, gate insulation layers and gate electrodes may be sequentially formed in each gate trench (block 750). Referring to FIGS. 7F and 8, one or more ion implantation steps may be performed to increase the second conductivity type dopant concentration in selected portions of the second conductivity type wells and/or to selectively implant first conductivity type dopants into upper portions of the second conductivity type wells (block 760). Finally, referring to FIGS. 7G and 8, source and drain contacts (and gate contacts in some cases) may be formed to complete the device.

In the description above, each example embodiment has a certain conductivity type. It will be appreciated that opposite conductivity type devices may be formed by simply reversing the conductivity of the n-type and p-type layers in each of the above embodiments. Thus, it will be appreciated that the present invention covers both re-channel and p-channel devices for each different device structure (e.g., MOSFET, IGBT, etc.):

While the present invention is described above with respect to power MOSFET and power IGBT implementations, it will be appreciated that the techniques described herein apply equally well to other similar vertical power devices having a gate trench.

It will also be appreciated that the different features of the different embodiments described herein may be combined to provide additional embodiments. For example, it was discussed above with respect to one embodiment that junction termination extensions could be used in place of guard rings. This is true in each embodiment disclosed herein. Likewise, the shield regions under the gate trenches may be included or omitted in any of the embodiments. Any of the embodiments may also include well regions that have varying dopant concentrations including lower doped channel regions.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a flow chart. It will be appreciated that the steps shown in the flow chart need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of forming a semiconductor device, the method comprising:
forming a wide band-gap semiconductor drift region on a substrate, the drift region and the substrate each doped with dopants having a first conductivity type;
implanting second conductivity type dopants into an upper surface of the drift region to form a termination structure in a termination region of the semiconductor device and a shielding pattern in an active region of the semiconductor device, the second conductivity type being opposite the first conductivity type;
forming a first conductivity type semiconductor layer on the upper surface of the drift region via epitaxial growth, the semiconductor layer having a first conductivity dopant concentration of less than $1\times10^{16}/cm^3$ in the completed semiconductor device; and
implanting second conductivity type dopants into the semiconductor layer in the active region to form well regions of the second conductivity type.

2. The method of claim 1, further comprising:
forming gate trenches in the semiconductor layer, the gate trenches extending into the upper surface of the drift region; and
sequentially forming a gate insulation layer and a gate electrode in each gate trench,
wherein the well regions are on opposed sides of the gate trenches.

3. The method of claim 2, wherein the gate trenches extend in a first direction on the drift region, and
wherein a first well region and a second well region of the well regions are separated from one another in the first direction, with a portion of the semiconductor layer therebetween.

4. The method of claim 3, wherein the first well region and the second well region extend in a second direction that intersects the first direction.

5. The method of claim 3, wherein the portion of the semiconductor layer is a first portion, and
wherein a second portion of the semiconductor layer is between the first well region and one of the gate trenches in a second direction that intersects the first direction.

6. The method of claim 2, wherein respective portions of the well regions that are adjacent the gate trenches comprise channel regions, wherein each channel region has a lower concentration of the second conductivity type dopants than a remainder of the well region.

7. The method of claim 2, wherein the gate trenches are formed before the second conductivity type dopants are implanted into the semiconductor layer in the active region.

8. The method of claim 2, wherein the gate trenches are formed after the second conductivity type dopants are implanted into the semiconductor layer in the active region.

9. A method of forming a semiconductor device, the method comprising:
forming a drift region on a substrate, wherein the drift region comprises a wide band-gap semiconductor material doped with dopants having a first conductivity type;
forming a termination structure in an upper portion of the drift region in a termination region of the semiconductor device, the termination structure comprising a plurality of termination elements that extend around a periphery of the semiconductor device;
forming a semiconductor layer on the drift region after forming the termination structure;
forming a plurality of well regions in the semiconductor layer, wherein the plurality of well regions are doped with dopants having a second conductivity type that is opposite the first conductivity type; and
forming a gate electrode having a longitudinal axis that extends in a first direction on the drift region,
wherein the semiconductor layer covers the termination elements.

10. The method of claim 9, wherein a portion of the semiconductor layer is between adjacent well regions in the first direction.

11. The method of claim 10, wherein the adjacent well regions comprise a first well region and a second well region that is separated in the first direction from the first well region.

12. The method of claim 11, wherein the first well region and the second well region extend in a second direction that intersects the first direction.

13. The method of claim 11, wherein the portion of the semiconductor layer is a first portion, and
wherein a second portion of the semiconductor layer is between the first well region and the gate electrode in a second direction that intersects the first direction.

14. The method of claim 9, further comprising:
forming gate trenches in the semiconductor layer, the gate trenches extending into the upper surface of the drift region; and
sequentially forming a gate insulation layer and a gate electrode in each gate trench,
wherein the well regions are on opposed sides of the gate trenches.

15. The method of claim 14, further comprising implanting second conductivity type dopants into the semiconductor layer in the active region to form well regions of the second conductivity type.

16. The method of claim 15, wherein the gate trenches are formed after the second conductivity type dopants are implanted into the semiconductor layer in the active region.

17. A method of forming a semiconductor device, the method comprising:
forming a wide band-gap semiconductor drift region on a substrate, the drift region and the substrate each doped with dopants having a first conductivity type;
implanting second conductivity type dopants into an upper surface of the drift region to form a termination structure that includes a plurality of termination elements in a termination region of the semiconductor device;
forming a semiconductor layer on an upper surface of the drift region via epitaxial growth,
implanting second conductivity type dopants into the semiconductor layer to form a plurality of second conductivity type well regions, the second conductivity type being opposite the first conductivity type;
forming gate trenches in the semiconductor layer, the gate trenches extending in a first direction on the drift region;
sequentially forming a gate insulation layer and a gate electrode in each gate trench; and
wherein an upper surface of the semiconductor layer that extends over the termination elements is coplanar with an upper surface of the second conductivity type well regions.

18. The method of claim 17, wherein the semiconductor layer has a dopant concentration of less than $1\times10^{16}/cm^3$ as grown.

19. The method of claim 17, wherein a first well region and a second well region of the plurality of second conductivity type well regions extend in a second direction that intersects the first direction, and wherein a portion of the semiconductor layer is between the first well region and the second well region.

20. The method of claim 19, wherein the portion of the semiconductor layer is a first portion, and
wherein a second portion of the semiconductor layer is between the first well region and the gate electrode in a second direction that intersects the first direction.

21. A method of forming a semiconductor device, the method comprising:
forming a wide band-gap semiconductor drift region on a substrate, the drift region and the substrate each doped with dopants having a first conductivity type;
implanting second conductivity type dopants into an upper surface of the drift region to form a termination structure in a termination region of the semiconductor device and a shielding pattern in an active region of the semiconductor device, the second conductivity type being opposite the first conductivity type;
forming a semiconductor layer on the upper surface of the drift region via epitaxial growth, the semiconductor layer having a dopant concentration of less than $1\times10^{16}/cm^3$ as grown; and
implanting second conductivity type dopants into the semiconductor layer in the active region to form well regions of the second conductivity type,
wherein the semiconductor layer is doped with first conductivity type dopants,
wherein the semiconductor layer covers the termination structure in the completed semiconductor device.

* * * * *